(12) United States Patent
Yamazaki

(10) Patent No.: US 9,548,396 B2
(45) Date of Patent: Jan. 17, 2017

(54) SEMICONDUCTOR DEVICE

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 14/966,177

(22) Filed: Dec. 11, 2015

(65) Prior Publication Data

US 2016/0099353 A1 Apr. 7, 2016

Related U.S. Application Data

(63) Continuation of application No. 14/594,958, filed on Jan. 12, 2015, now Pat. No. 9,214,566, which is a
(Continued)

(30) Foreign Application Priority Data

Feb. 2, 2012 (JP) ................. 2012-020510

(51) Int. Cl.
H01L 29/12 (2006.01)
H01L 29/786 (2006.01)
(Continued)

(52) U.S. Cl.
CPC ........... *H01L 29/7869* (2013.01); *H01L 29/04* (2013.01); *H01L 29/045* (2013.01); *H01L 29/24* (2013.01);
(Continued)

(58) Field of Classification Search
CPC ..................... H01L 29/7869; H01L 29/7896
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2159845 A 3/2010
(Continued)

OTHER PUBLICATIONS

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.
(Continued)

*Primary Examiner* — Dung Le
(74) *Attorney, Agent, or Firm* — Eric J. Robinson; Robinson Intellectual Property Law Office, P.C.

(57) ABSTRACT

A semiconductor device in which a first oxide film, a second oxide film, and a third oxide film are stacked over an insulating surface is provided. In the semiconductor device, each of the first oxide film, the second oxide film, and the third oxide film comprises indium, gallium, and zinc. The third oxide film is in contact with a side surface of the second oxide film. A gallium content is higher than an indium content in the third oxide film. The gallium content is higher than a zinc content in the third oxide film. An indium content in the second oxide film is higher than the indium content in the third oxide film.

19 Claims, 14 Drawing Sheets

Related U.S. Application Data continuation of application No. 14/264,311, filed on Apr. 29, 2014, now Pat. No. 8,946,704, which is a continuation of application No. 13/751,721, filed on Jan. 28, 2013, now Pat. No. 8,723,176.

(51) Int. Cl.
*H01L 29/04* (2006.01)
*H01L 29/24* (2006.01)

(52) U.S. Cl.
CPC ... *H01L 29/78693* (2013.01); *H01L 29/78696* (2013.01)

(58) Field of Classification Search
USPC .................................. 257/40, 43, 57, 72, 79
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,994,500 B2 | 8/2011 | Kim et al. |
| 8,058,645 B2 | 11/2011 | Jeong et al. |
| 8,058,647 B2 | 11/2011 | Kuwabara et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,274,078 B2 | 9/2012 | Itagaki et al. |
| 8,436,350 B2 | 5/2013 | Yamazaki et al. |
| 8,497,502 B2 | 7/2013 | Yaegashi |
| 8,530,289 B2 | 9/2013 | Yamazaki |
| 8,530,892 B2 | 9/2013 | Yamazaki et al. |
| 8,728,883 B2 | 5/2014 | Yamazaki et al. |
| 8,748,215 B2 | 6/2014 | Yamazaki |
| 8,748,889 B2 | 6/2014 | Sasaki et al. |
| 8,884,272 B2 | 11/2014 | Hama et al. |
| 9,082,857 B2 | 7/2015 | Yamazaki et al. |
| 9,240,488 B2 | 1/2016 | Yamazaki et al. |
| 9,378,980 B2 | 6/2016 | Yamazaki et al. |
| 9,397,194 B2 | 7/2016 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0025677 A1* | 2/2010 | Yamazaki ........... H01L 27/1225 257/43 |
| 2010/0051937 A1 | 3/2010 | Kaji et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0320458 A1 | 12/2010 | Umeda et al. |
| 2010/0320459 A1 | 12/2010 | Umeda et al. |
| 2011/0017995 A1 | 1/2011 | Yamazaki et al. |
| 2011/0024751 A1 | 2/2011 | Yamazaki et al. |
| 2011/0079778 A1 | 4/2011 | Yamazaki et al. |
| 2011/0101335 A1 | 5/2011 | Yamazaki et al. |
| 2011/0121289 A1* | 5/2011 | Miyanaga ........... H01L 29/7869 257/43 |
| 2011/0193083 A1 | 8/2011 | Kim et al. |
| 2011/0215328 A1 | 9/2011 | Morosawa et al. |
| 2011/0248261 A1 | 10/2011 | Yamazaki |
| 2012/0119205 A1 | 5/2012 | Taniguchi et al. |
| 2013/0020571 A1 | 1/2013 | Yamazaki et al. |
| 2013/0161608 A1 | 6/2013 | Yamazaki |
| 2013/0161611 A1 | 6/2013 | Yamazaki et al. |
| 2013/0164920 A1 | 6/2013 | Yamazaki |

(56) References Cited

U.S. PATENT DOCUMENTS

| | | | |
|---|---|---|---|
| 2014/0349443 | A1 | 11/2014 | Yamazaki |
| 2014/0367682 | A1 | 12/2014 | Yamazaki et al. |
| 2016/0293767 | A1 | 10/2016 | Yamazaki et al. |

FOREIGN PATENT DOCUMENTS

| | | | |
|---|---|---|---|
| EP | 2226847 | A | 9/2010 |
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2006-165528 | A | 6/2006 |
| JP | 2007-109918 | A | 4/2007 |
| JP | 2009-231613 | A | 10/2009 |
| JP | 2010-016347 | A | 1/2010 |
| JP | 2010-034534 | A | 2/2010 |
| JP | 4415062 | | 2/2010 |
| JP | 2010-062229 | A | 3/2010 |
| JP | 2010-067954 | A | 3/2010 |
| JP | 2010-080952 | A | 4/2010 |
| JP | 2010-177431 | A | 8/2010 |
| JP | 2010-199566 | A | 9/2010 |
| JP | 4571221 | | 10/2010 |
| JP | 2011-066375 | A | 3/2011 |
| JP | 2011-100980 | A | 5/2011 |
| JP | 2011-119706 | A | 6/2011 |
| JP | 2011-135066 | A | 7/2011 |
| JP | 2011-146694 | A | 7/2011 |
| JP | 2012-160679 | A | 8/2012 |
| WO | WO-2004/114391 | | 12/2004 |
| WO | WO-2008/133345 | | 11/2008 |
| WO | WO-2011/043163 | | 4/2011 |
| WO | WO-2011/052384 | | 5/2011 |
| WO | WO-2011/065216 | | 6/2011 |
| WO | WO-2011/074407 | | 6/2011 |

OTHER PUBLICATIONS

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Dembo.H et al., "RFCPUs on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m = 3, 4, and 5), $InGaO_3(ZnO)_3$, and $Ga_2O_3(ZnO)_m$ m(m = 7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

(56) References Cited

OTHER PUBLICATIONS

Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUs on Flexible and Glass Substrates for Secure RFID Systems", Journal of Solid-State Circuits, 2008, vol. 43, No. 1, pp. 292-299.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-in. AMOLED Display With Driver Circuit Using Amorphous In—Ga—Zn—Oxide TFTs", IDW '09 : Proceedings of the 16th International Display Workshops, 2009, pp. 689-692.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn]at Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples,"J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.

(56) References Cited

OTHER PUBLICATIONS

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

\* cited by examiner

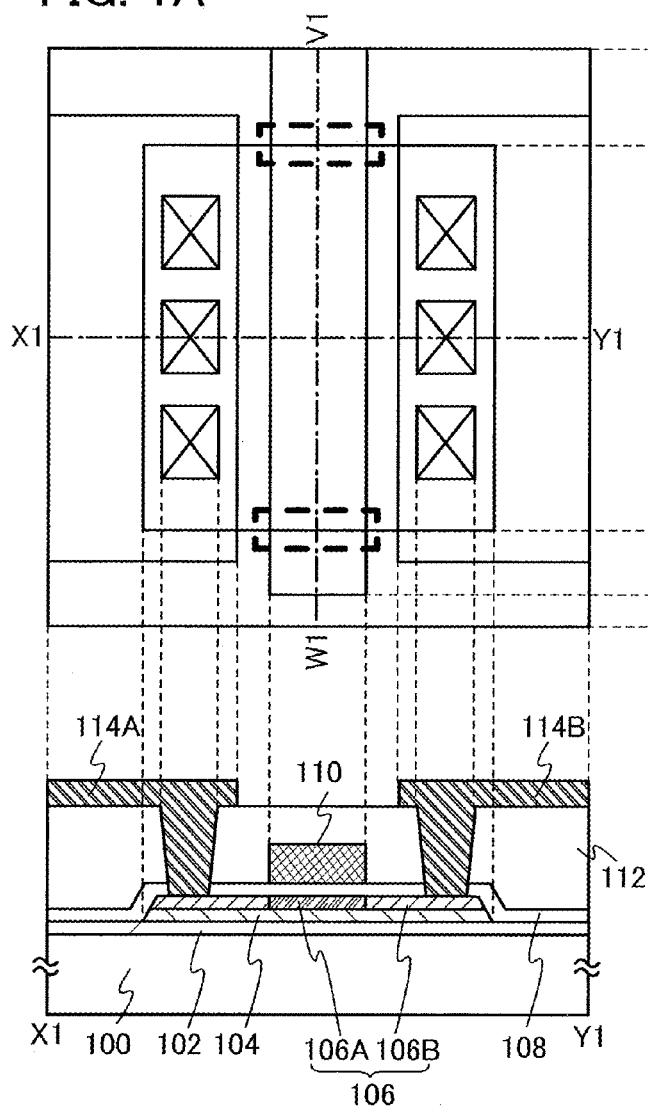
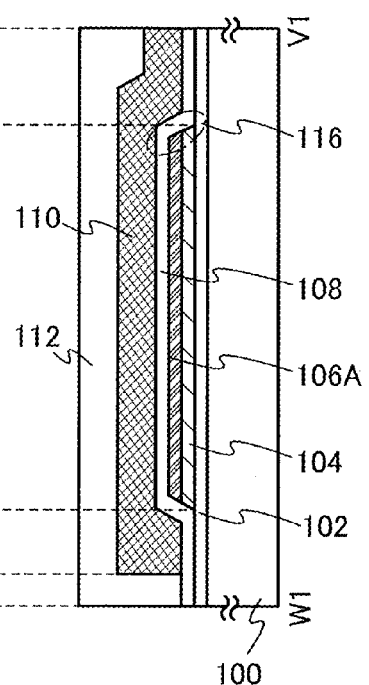

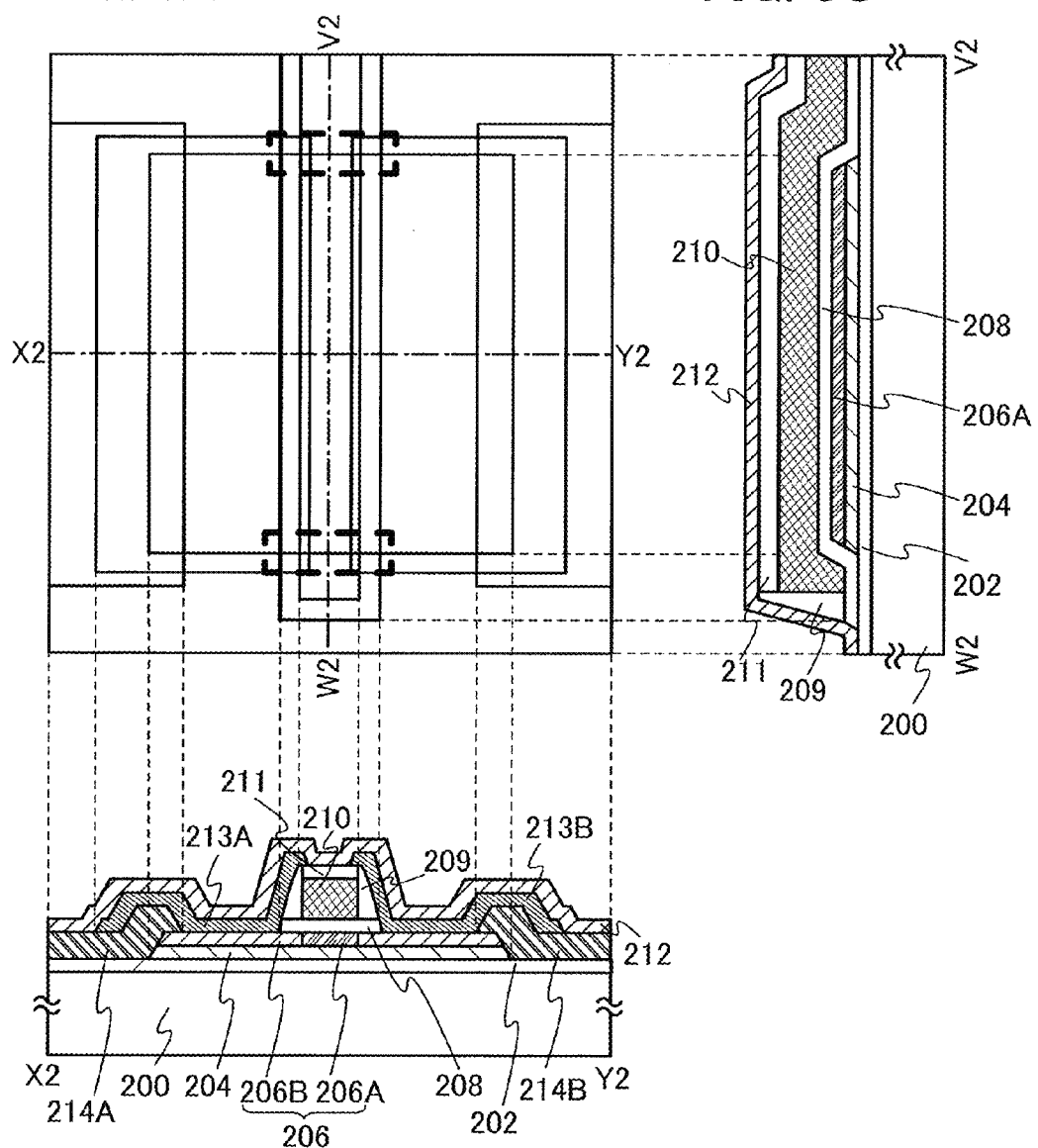

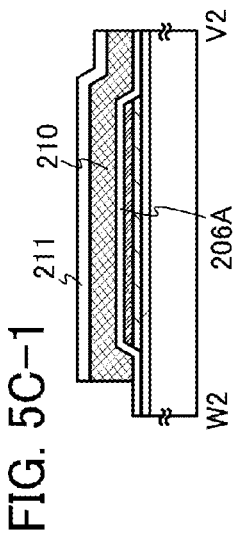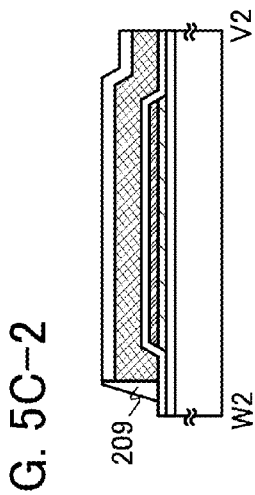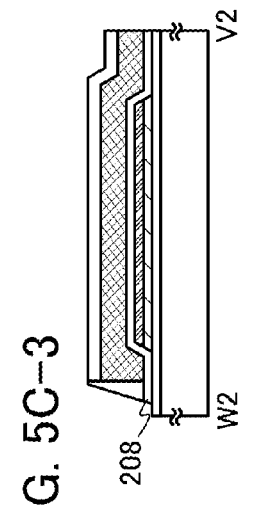
FIG. 5C-1  FIG. 5C-2  FIG. 5C-3
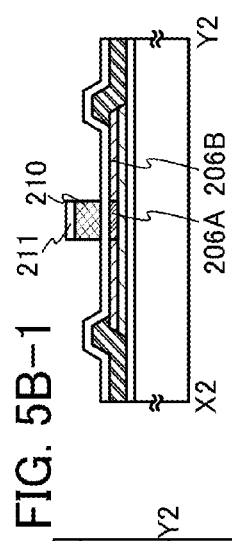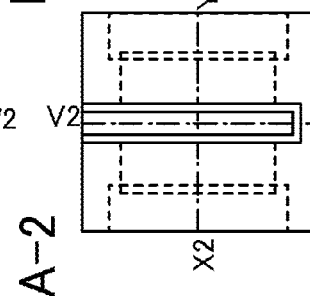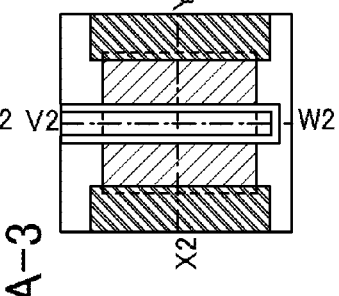
FIG. 5B-1  FIG. 5B-2  FIG. 5B-3
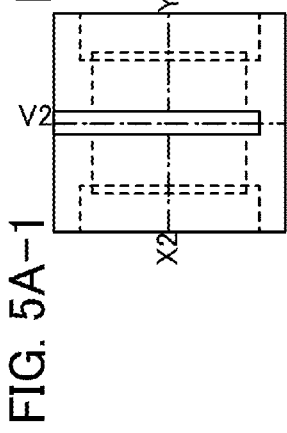
FIG. 5A-1  FIG. 5A-2  FIG. 5A-3

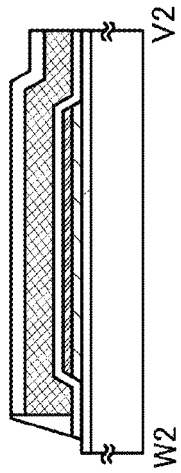
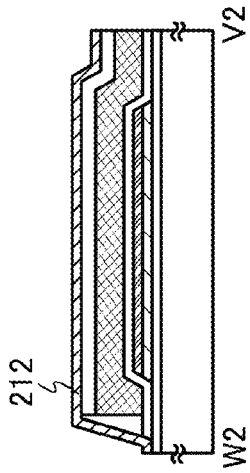
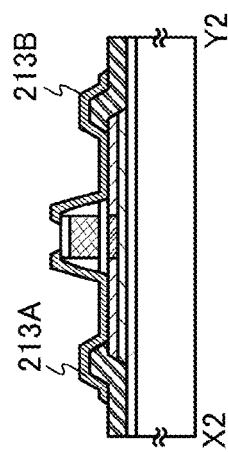
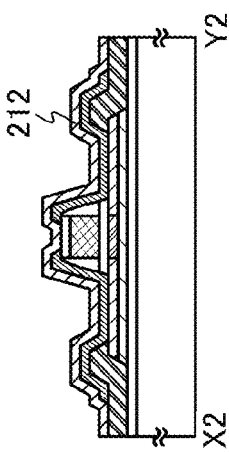
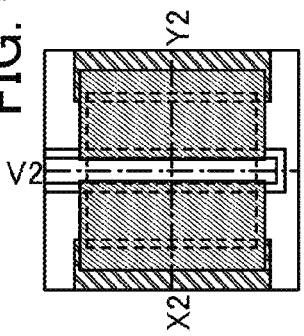
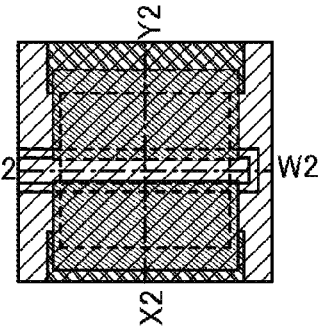

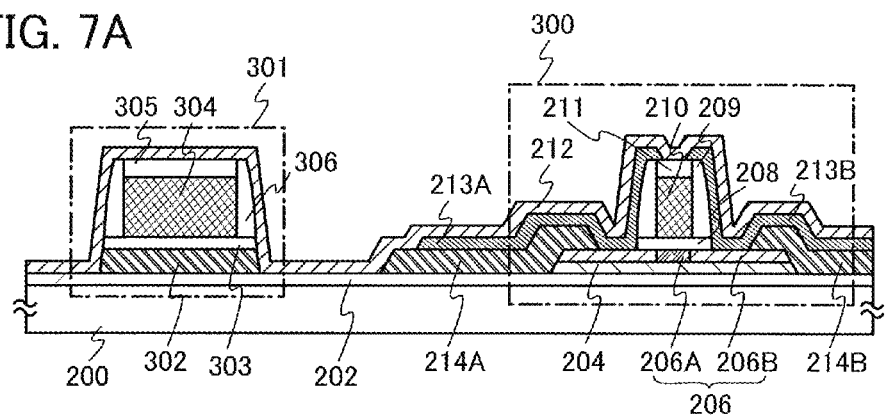
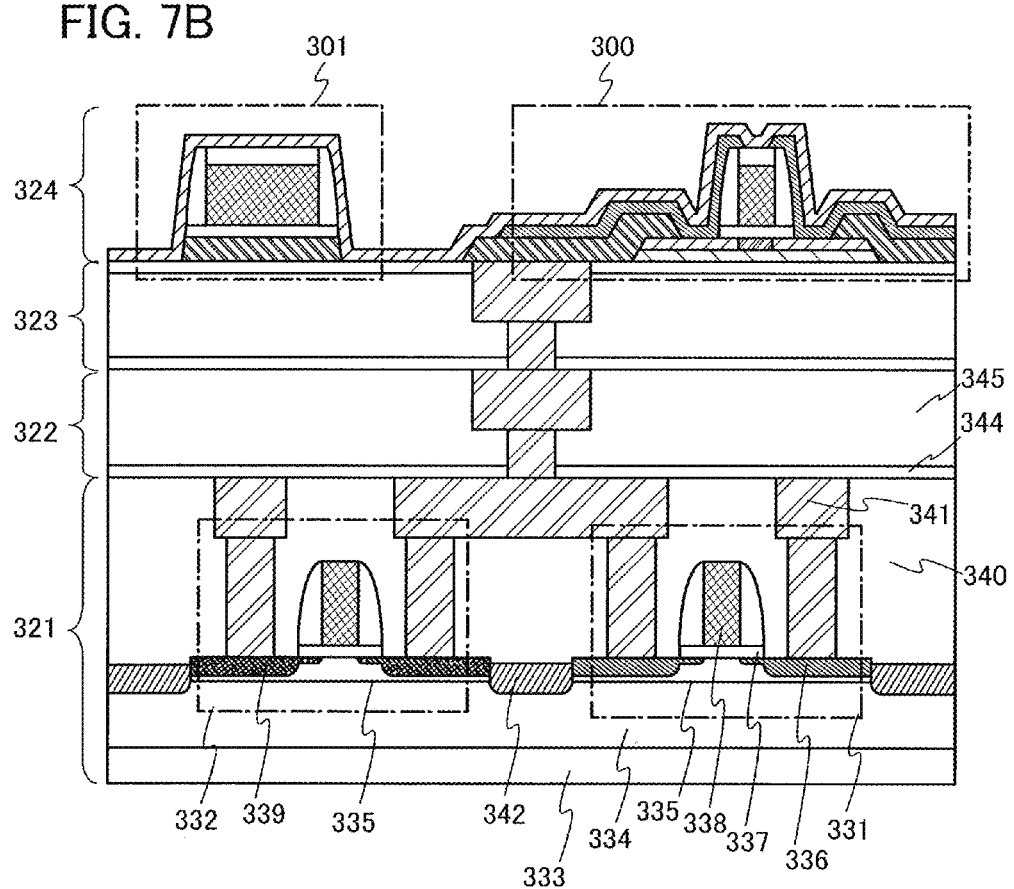

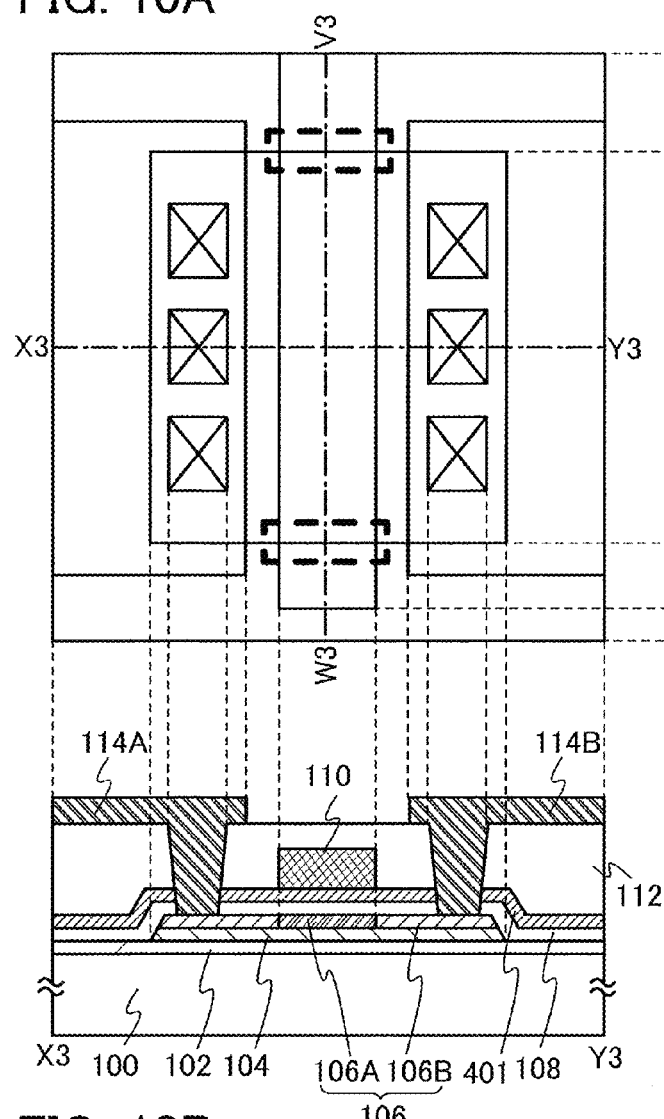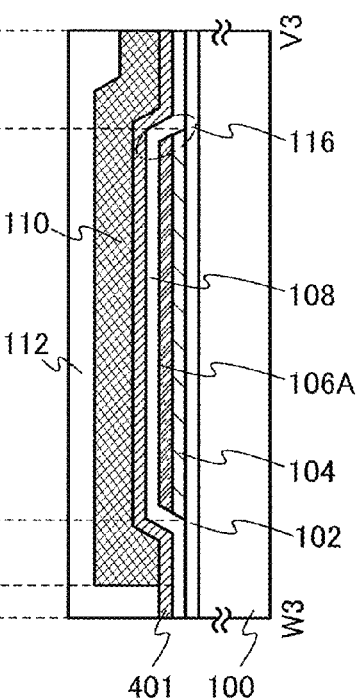

FIG. 11A
model A
FIG. 11B
model B
FIG. 11C
model C
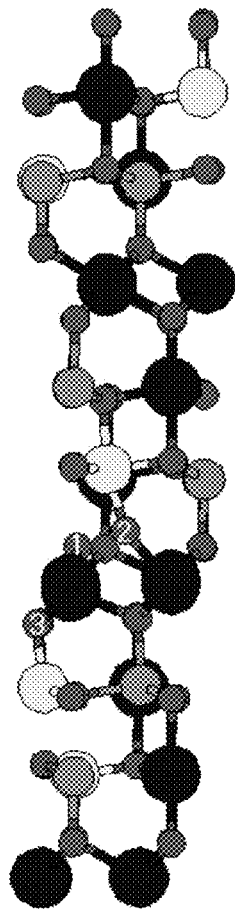
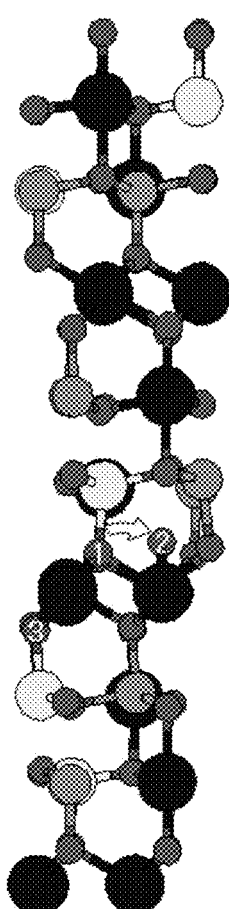
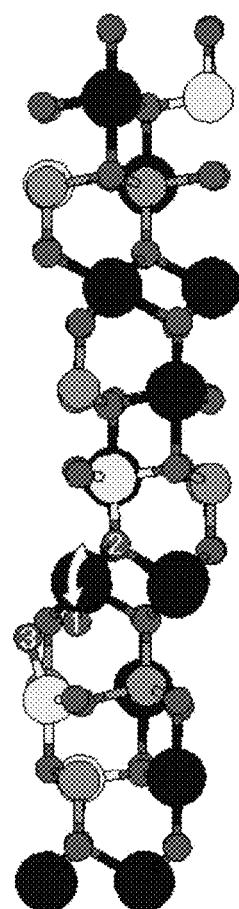
legend
In: ● Ga: ○ Zn: ● O: ● model A   model B   model C legend
In: ● Ga: ○ Zn: ● O: ●

SEMICONDUCTOR DEVICE

BACKGROUND OF THE INVENTION

1. Field of the Invention

The present invention relates to a semiconductor device including an oxide semiconductor.

In this specification, a semiconductor device refers to all types of devices which can function by utilizing semiconductor characteristics; an electro-optical device, a semiconductor circuit, and an electronic device are all semiconductor devices.

2. Description of the Related Art

A technique by which a transistor is formed with a semiconductor thin film formed over a substrate having an insulating surface has been attracting attention. The transistor is applied to a wide range of electronic devices such as an integrated circuit (IC) and an image display device (display device). A silicon-based semiconductor material is widely known as a material for a semiconductor thin film applicable to the transistor. As another material, an oxide semiconductor has been attracting attention.

For example, a transistor that includes an amorphous oxide semiconductor film containing indium (In), gallium (Ga), and zinc (Zn) is disclosed (see Patent Document 1).

REFERENCE

[Patent Document 1] Japanese Published Patent Application No. 2006-165528

SUMMARY OF THE INVENTION

A transistor that includes an oxide semiconductor film operates faster (it can also be said that the field-effect mobility is higher) than a transistor that includes an amorphous silicon film and is manufactured more easily than a transistor that includes a polycrystalline silicon film.

However, some problems of the transistor that includes an oxide semiconductor film have been pointed out. One of the problems is unstable electrical characteristics of the transistor. Specifically, a problem that the threshold voltage of the transistor is negatively shifted by a bias-temperature stress test (also referred to as a BT stress test) or irradiation with visible light or ultraviolet light, so that the transistor tends to be normally on, has been pointed out. As one of factors of the problem, oxygen vacancies and the like in the oxide semiconductor film can be given.

When the oxide semiconductor film is amorphous, for example, the bonding state of metal atoms and oxygen atoms in the oxide semiconductor film is not ordered; thus, an oxygen vacancy is generated easily. For this reason, the electrical characteristics (e.g., electrical conductivity) of the oxide semiconductor film might be changed. This change causes variations in the electrical characteristics of a transistor that includes such an oxide semiconductor film, which leads to reduction in reliability of a semiconductor device including the transistor.

Note that the oxide semiconductor film can be a single crystal state, a polycrystalline (also referred to as polycrystal) state, or the like in addition to an amorphous state as described above. Further, as the state of the oxide semiconductor film in which oxygen vacancies that cause variation in the electrical characteristics of the transistor can be reduced, the oxide semiconductor film can be a CAAC oxide semiconductor (also referred to as c-axis aligned crystal oxide semiconductor: CAAC-OS) film.

Here, the CAAC oxide semiconductor film will be described in detail.

The CAAC oxide semiconductor film is not absolutely amorphous. The CAAC oxide semiconductor film, for example, includes an oxide semiconductor with a crystal-amorphous mixed phase structure where crystal parts and amorphous parts are intermingled. Note that in most cases, the crystal part fits inside a cube whose one side is less than 100 nm. From an observation image obtained with a transmission electron microscope (TEM), a boundary between an amorphous part and a crystal part and a boundary between crystal parts in the CAAC oxide semiconductor film are not clearly detected. Further, with the TEM, a grain boundary in the CAAC oxide semiconductor film is not clearly found. Thus, in the CAAC oxide semiconductor film, reduction in electron mobility, due to the grain boundary, is suppressed.

In each of the crystal parts included in the CAAC oxide semiconductor film, for example, a c-axis is aligned in a direction parallel to a normal vector of the surface where the CAAC oxide semiconductor film is formed or to a normal vector of the top surface of the CAAC oxide semiconductor film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part.

In this specification, a simple term "perpendicular" includes a range from 80° to 100°, preferably from 85° to 95°. In addition, a simple term "parallel" includes a range from −10° to 10°, preferably from −5° to 5°.

In the CAAC oxide semiconductor film, distribution of crystal parts is not necessarily uniform. For example, in the formation process of the CAAC oxide semiconductor film, in the case where crystal growth occurs from a surface side of the oxide semiconductor film, the proportion of crystal parts in the vicinity of the top surface of the oxide semiconductor film is in some cases higher than that in the vicinity of the surface where the oxide semiconductor film is formed. Further, when an impurity is added to the CAAC oxide semiconductor film, the crystal part in a region to which the impurity is added becomes amorphous in some cases.

Since the c-axes of the crystal parts included in the CAAC oxide semiconductor film are aligned in the direction parallel to a normal vector of the surface where the CAAC oxide semiconductor film is formed or to a normal vector of the top surface of the CAAC oxide semiconductor film, the directions of the c-axes may be different from each other depending on the shape of the CAAC oxide semiconductor film (the cross-sectional shape of the surface where the CAAC oxide semiconductor film is formed or the cross-sectional shape of the top surface of the CAAC oxide semiconductor film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-oxide semiconductor film is formed or a normal vector of the surface of the CAAC-oxide semiconductor film.

With the use of the above-described CAAC oxide semiconductor film in a transistor, change in electrical characteristics of the transistor due to irradiation with visible light or ultraviolet light is small. Thus, the transistor has high reliability.

In this specification, the CAAC oxide semiconductor film including the crystal parts each having the following features is referred to as an oxide semiconductor film including c-axis aligned crystal parts: c-axes are aligned in a direction parallel to a normal vector of the surface where the CAAC oxide semiconductor film is formed or to a normal vector of the top surface of the CAAC oxide semiconductor film; triangular or hexagonal atomic arrangement which is seen from the direction perpendicular to the a-b plane is formed; and metal atoms are arranged in a layered manner or metal atoms and oxygen atoms are arranged in a layered manner when seen from the direction perpendicular to the c-axis.

Moreover, in an In—Ga—Zn-based oxide (hereinafter referred to as IGZO) film which is an example of the oxide semiconductor film including c-axis aligned crystal parts, it is evident from a computation on the basis of the density functional theory that oxygen moves easily in a plane having an a-axis and a b-axis, whereas oxygen is difficult to move in a c-axis and an oxygen vacancy is difficult to be generated. Specifically, in arrangement of an In—O layer, a Ga—O layer, and Zn—O layer in the IGZO film in a layered manner when seen from the direction perpendicular to the c-axis, oxygen moves along the In—O layer more easily than across the In—O layer. In other words, in the oxide semiconductor film including c-axis aligned crystal parts, oxygen moves easily along a direction parallel to the surface where the film is formed or to the top surface of the film.

In consideration of mobility of oxygen, oxygen is released from side surfaces of the oxide semiconductor film including c-axis aligned crystal parts, in which case an oxygen vacancy is generated easily. In the case where such an oxide semiconductor film including c-axis aligned crystal parts is processed into an island shape in the transistor that includes the oxide semiconductor film, the side surfaces are exposed and an oxygen vacancy is generated easily. When an oxygen vacancy is continued to be generated easily, variations in the electrical characteristics of the transistor is caused, which leads to reduction in reliability of a semiconductor device including the transistor.

Thus, one object of one embodiment of the present invention is to provide a semiconductor device in which release of oxygen from side surfaces of an oxide semiconductor film including c-axis aligned crystal parts can be prevented and sufficient oxygen can be contained in the oxide semiconductor film including c-axis aligned crystal parts. Another object of one embodiment of the present invention is to improve the reliability of a semiconductor device formed using a transistor that includes an oxide semiconductor film including c-axis aligned crystal parts.

According to one embodiment of the present invention, a semiconductor device includes an island-like semiconductor film including a first oxide semiconductor film and a second oxide semiconductor film including a c-axis aligned crystal part, which is stacked over the first oxide semiconductor film; and an oxide film including a c-axis aligned crystal part, which is in contact with side surfaces of the island-like semiconductor film. In the semiconductor device, the first oxide semiconductor film, the second oxide semiconductor film, and the oxide film each include an oxide containing indium, gallium, and zinc, and the second oxide semiconductor film has a higher indium content than the first oxide semiconductor film, the first oxide semiconductor film has a higher indium content than the oxide film, the oxide film has a higher gallium content than the first oxide semiconductor film, and the first oxide semiconductor film has a higher gallium content than the second oxide semiconductor film.

According to another embodiment of the present invention, a semiconductor device includes an island-like semiconductor film including a first oxide semiconductor film and a second oxide semiconductor film including a c-axis aligned crystal part, which is stacked over the first oxide semiconductor film; an oxide film including a c-axis aligned crystal part, which is in contact with side surfaces of the island-like semiconductor film; and a gate electrode provided over the oxide film. In the semiconductor device, the first oxide semiconductor film, the second oxide semiconductor film, and the oxide film each include an oxide containing indium, gallium, and zinc, and the second oxide semiconductor film has a higher indium content than the first oxide semiconductor film, the first oxide semiconductor film has a higher indium content than the oxide film, the oxide film has a higher gallium content than the first oxide semiconductor film, and the first oxide semiconductor film has a higher gallium content than the second oxide semiconductor film.

According to another embodiment of the present invention, a semiconductor device includes an island-like semiconductor film including a first oxide semiconductor film and a second oxide semiconductor film including a c-axis aligned crystal part, which is stacked over the first oxide semiconductor film; a source electrode and a drain electrode which are in contact with side surfaces of the island-like semiconductor film in a channel length direction; an oxide film including a c-axis aligned crystal part, which is in contact with the side surfaces of the island-like semiconductor film in a channel width direction; and a gate electrode provided over the oxide film. In the semiconductor device, the first oxide semiconductor film, the second oxide semiconductor film, and the oxide film each include an oxide containing indium, gallium, and zinc, and the second oxide semiconductor film has a higher indium content than the first oxide semiconductor film, the first oxide semiconductor film has a higher indium content than the oxide film, the oxide film has a higher gallium content than the first oxide semiconductor film, and the first oxide semiconductor film has a higher gallium content than the second oxide semiconductor film.

According to the embodiment of the present invention, a side surface of the gate electrode is preferred to be provided with a sidewall.

According to the embodiment of the present invention, the oxide film is preferred to have a structure in which an inorganic insulating film is stacked over a film including an oxide containing indium (In), gallium (Ga), and zinc (Zn).

According to the embodiment of the present invention, an aluminum oxide film is preferred to be provided over the gate electrode, the source electrode, and the drain electrode.

According to the embodiment of the present invention, the first oxide semiconductor film is preferred to be a film including an oxide containing In, Ga, and Zn at an atomic ratio of 1:1:1.

According to the embodiment of the present invention, the second oxide semiconductor film is preferred to be a film including an oxide containing In, Ga, and Zn at an atomic ratio of 3:1:2.

According to the embodiment of the present invention, the oxide film is preferred to be a film including an oxide containing In, Ga, and Zn at an atomic ratio of 1:3:2.

According to the embodiment of the present invention, in the crystal part of the second oxide semiconductor film and the crystal part of the oxide film, metal atoms and oxygen atoms contained in the second oxide semiconductor film and the oxide film are arranged in a layered manner along a c-axis direction parallel to a normal vector of the surface where the second oxide semiconductor film is formed and to a normal vector of the surface where the oxide film is formed.

According to one embodiment of the present invention, release of oxygen from side surfaces of an oxide semiconductor film including c-axis aligned crystal parts can be prevented and sufficient oxygen can be contained in the oxide semiconductor film including c-axis aligned crystal parts. Moreover, according to one embodiment of the present invention, the reliability of a semiconductor device formed using a transistor that includes an oxide semiconductor film including c-axis aligned crystal parts can be improved.

BRIEF DESCRIPTION OF THE DRAWINGS

FIG. 1A is a plan view and FIGS. 1B and 1C are cross-sectional views, which illustrate one embodiment of a semiconductor device.

FIG. 3A is a plan view and FIGS. 3B and 3C are cross-sectional views, which illustrate one embodiment of a semiconductor device.

FIGS. 5A-1 to 5A-3 are plan views and FIGS. 5B-1 to 5B-3 and FIGS. 5C-1 to 5C-3 are cross-sectional views, which illustrate an example of a manufacturing process of a semiconductor device.

FIGS. 6A-1 and 6A-2 are plan views and FIGS. 6B-1 and 6B-2 and FIGS. 6C-1 and 6C-2 are cross-sectional views, which illustrate an example of a manufacturing process of a semiconductor device.

FIGS. 7A and 7B are cross-sectional views illustrating one embodiment of a semiconductor device.

FIG. 10A is a plan view and FIGS. 10B and 10C are cross-sectional views, which illustrate one embodiment of a semiconductor device.

FIGS. 11A to 11C are diagrams for describing a structure of Example.

DETAILED DESCRIPTION OF THE INVENTION

Figure 2A:
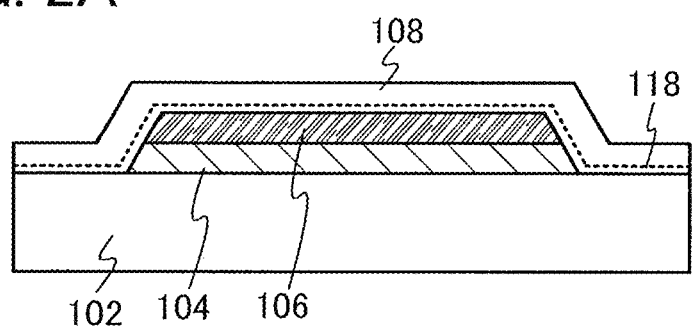
FIGS. 2A and 2B are cross-sectional views each illustrating a semiconductor device of Embodiment 1.

Embodiments of the invention disclosed in this specification will be described below with reference to the accompanying drawings. Note that the present invention is not limited to the following description and it will be readily appreciated by those skilled in the art that modes and details can be modified in various ways without departing from the spirit and the scope of the present invention. Therefore, the present invention should not be construed as being limited to the description in the following embodiments.

Note that the position, size, shape, or the like of each component illustrated in drawings and the like is not accurately represented in some cases for easy understanding. Therefore, the disclosed invention is not necessarily limited to the position, size, shape, or the like as disclosed in the drawings and the like.

In this specification and the like, ordinal numbers such as "first", "second", and "third" are used in order to avoid confusion among components, and the terms do not limit the components numerically.

Embodiment 1

In this embodiment, a structure of a transistor that includes an oxide semiconductor film including c-axis aligned crystal parts in a semiconductor device will be described.

FIGS. 1A to 1C illustrate a transistor of one embodiment of the present invention. FIG. 1A is a plan view of the transistor. FIG. 1B is a cross-sectional view taken along line X1-Y1 in a channel length direction in FIG. 1A, and FIG. 1C is a cross-sectional view taken along line V1-W1 in a channel width direction in FIG. 1A.

The transistor illustrated in FIGS. 1A to 1C includes an oxidation film 102 over a substrate 100, a first oxide semiconductor film 104 over the oxidation film 102, a second oxide semiconductor film 106 over the first oxide semiconductor film 104, an oxide film 108 covering at least side surfaces of the first island-like oxide semiconductor film 104 and the second island-like oxide semiconductor film 106, a gate electrode 110 over the oxide film 108, an interlayer insulating film 112 covering the gate electrode 110, and a source electrode 114A and a drain electrode 114B over the interlayer insulating film 112 and connected to the second oxide semiconductor film 106. Note that the second oxide semiconductor film 106 includes a channel region 106A in a region overlapping with the gate electrode 110 and low-resistance regions 106B which have lower resistance than the channel region in regions connected to the source electrode 114A and the drain electrode 114B.

Note that a side surface of an island-like film is exposed perpendicular to a substrate face in one case and is tapered by being exposed in an inclined manner with respect to the substrate face in another case.

The transistor illustrated in FIGS. 1A to 1C has a structure in which the first island-like oxide semiconductor film 104 and the second island-like oxide semiconductor film 106 are stacked. According to one embodiment of the present invention, the first oxide semiconductor film 104 and the second oxide semiconductor film 106 each include an oxide containing at least indium, zinc, and gallium, and the second oxide semiconductor film 106 has a higher indium content than the first oxide semiconductor film 104. The higher indium content of the second oxide semiconductor film 106 can lead to higher crystallinity of the second oxide semiconductor film 106.

Moreover, according to one embodiment of the present invention, the first oxide semiconductor film 104 has a gallium content which is the same as the indium content thereof and has a higher gallium content than the second oxide semiconductor film 106. Further, the first oxide semiconductor film 104 can suppress diffusion of oxygen which is released from the oxidation film 102 at the formation of the second oxide semiconductor film 106, silicon, or the like. As a result, by providing the first oxide semiconductor film 104, entry of an impurity such as silicon into the second oxide semiconductor film 106 can be reduced, and the crystallinity of the second oxide semiconductor film 106 can be improved.

For example, in the case where the first oxide semiconductor film 104 is not formed, the second oxide semiconductor film 106 is to be directly formed on the oxidation film 102 by thermal film formation at approximately 400° C. In that case, oxygen is released from the oxidation film 102 before the second oxide semiconductor film 106 is formed. As a result, oxygen cannot be supplied from the oxidation film 102 to the second oxide semiconductor film 106 in a later process.

In contrast, in a structure described in this embodiment in which after the oxidation film 102 is formed, the first oxide semiconductor film 104 can be formed at a low temperature (e.g., higher than or equal to room temperature and lower than or equal to 200° C.) and the second oxide semiconductor film 106 can be formed at a high temperature (e.g., higher than or equal to 250° C. and lower than or equal to 500° C., preferably higher than or equal to 300° C. and lower than or equal to 400° C.), the first oxide semiconductor film 104 can suppress oxygen release from the oxidation film 102.

Further, the second oxide semiconductor film 106 is formed over the first oxide semiconductor film 104 which is formed using the same kinds of materials as the second oxide semiconductor film 106. Accordingly, the second oxide semiconductor film 106 can be a film including c-axis aligned crystal parts that grow from the interface with the first oxide semiconductor film 104.

In other words, the first oxide semiconductor film 104 suppresses oxygen release from the oxidation film 102 in a manufacturing process, and also serves as a base film for the second oxide semiconductor film 106. As a result, the crystallinity of the second oxide semiconductor film 106 can be improved. After the second oxide semiconductor film 106 is formed, oxygen is released from the oxidation film 102 by heat treatment or the like, and then the oxygen can pass through the first oxide semiconductor film 104 to be supplied to the second oxide semiconductor film 106.

A structure in which the first oxide semiconductor film 104 and the second oxide semiconductor film 106 are thus stacked has an excellent effect of suppressing the generation of an oxygen vacancy in the second oxide semiconductor film 106 and of improving the crystallinity of the second oxide semiconductor film 106.

High crystallinity of the second oxide semiconductor film 106 can make the bonding state of metal atoms and oxygen atoms in the second oxide semiconductor film 106 ordered, thereby suppressing the generation of an oxygen vacancy. Even though an oxygen vacancy is generated, the oxygen vacancy can be compensated with oxygen supplied from the oxidation film 102.

Further, in addition to the above structure in which the first oxide semiconductor film 104 and the second oxide semiconductor film 106 are stacked, in the transistor of one embodiment of the present invention, which is illustrated in FIGS. 1A to 1C, the oxide film 108 is provided so as to cover the side surfaces of the first island-like oxide semiconductor film 104 and the second island-like oxide semiconductor film 106 including c-axis aligned crystal parts. According to one embodiment of the present invention, as well as the second oxide semiconductor film 106, the oxide film 108 can include c-axis aligned crystal parts and can have an oxygen-transmitting property which is lower in a perpendicular direction than in a horizontal direction to the surface where the film is formed.

According to one embodiment of the present invention, the film having a low oxygen-transmitting property has the same elements as the first oxide semiconductor film 104 and the second oxide semiconductor film 106. In other words, in the case where the first oxide semiconductor film 104 and the second oxide semiconductor film 106 are IGZO films, the oxide film 108 is also an IGZO film containing indium, gallium, and zinc. In particular, the oxide film 108 has a higher gallium content than the first oxide semiconductor film 104 and the second oxide semiconductor film 106 and a lower indium content than the first oxide semiconductor film 104 and the second oxide semiconductor film 106.

Since the oxide film 108 has the same elements as the first oxide semiconductor film 104 and the second oxide semiconductor film 106, the state of an interface with the first island-like oxide semiconductor film 104 and the second island-like oxide semiconductor film 106 can be favorable. Thus, as well as the second oxide semiconductor film 106, the oxide film 108 can include c-axis aligned crystal parts.

Moreover, the oxide film 108 can have a large energy gap by having a higher gallium content and a lower indium content than the first oxide semiconductor film 104 and the second oxide semiconductor film 106.

Further, since the oxide film 108 as well as the first oxide semiconductor film 104 and the second oxide semiconductor film 106 contains indium, the oxide film 108 can be a film including c-axis aligned crystal parts, which is the same as the second oxide semiconductor film 106.

Furthermore, in the oxide film 108 as well as the second oxide semiconductor film 106 containing indium, oxygen moves easily in a plane having an a-axis and a b-axis, whereas oxygen is difficult to move in a c-axis and an oxygen vacancy is difficult to be generated, because c-axis aligned crystal parts are included. In arrangement of an In—O layer, a Ga—O layer, and Zn—O layer in the above film in a layered manner when seen from the direction perpendicular to the c-axis, oxygen moves along the In—O layer more easily than across the In—O layer. The oxide film 108 can have a low oxygen-transmitting property in the c-axis direction parallel to a normal vector of the surface where the second oxide semiconductor film 106 is formed and to a normal vector of the surface where the oxide film 108 is formed by utilizing a property of oxygen which difficult to move across the In—O layer.

By providing the oxide film 108 having a low oxygen-transmitting property in the c-axis direction on the side surfaces of the second oxide semiconductor film 106, a state in which oxygen is easily released from the second oxide semiconductor film 106 and an oxygen vacancy is easily generated can be suppressed.

When the conductivity in a portion indicated by a thick dotted line in FIG. 1A is increased due to oxygen vacancies, a parasitic channel is generated. This parasitic channel causes reduction in switching characteristics and signal delay. However, reduction in resistance of the portion indicated by a thick dotted line in FIG. 1A can be suppressed by providing the portion with the oxide film 108 having a low oxygen-transmitting property in the c-axis direction. In other words, in the cross-sectional view of FIG. 1C in the channel width direction, release of oxygen and generation of a parasitic channel in a region 116 corresponding to a side surface of the second oxide semiconductor film 106 can be suppressed.

In the oxide film 108, gallium functions as a stabilizer. Therefore, part or the whole of gallium can be replaced with another stabilizer such as tin (Sn), hafnium (Hf), aluminum (Al), and zirconium (Zr) which can be exemplified. Further, as another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

Figure 2B:
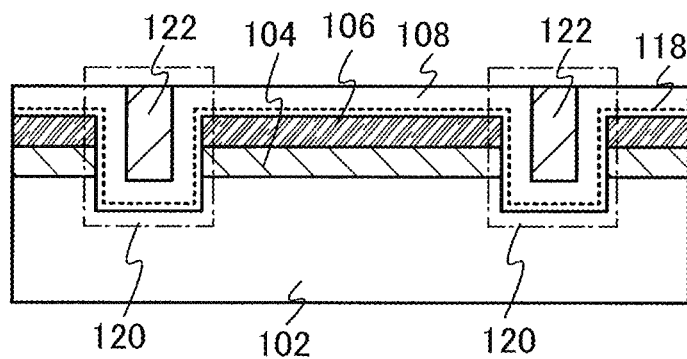

FIGS. 2A and 2B are cross-sectional views illustrating only the oxidation film 102, the first oxide semiconductor film 104, the second oxide semiconductor film 106, and the oxide film 108.

As described above, the oxide film 108 can have a low oxygen-transmitting property in the c-axis direction parallel to a normal vector of the surface where the film is formed by utilizing a property of oxygen which is difficult to move across an In—O layer. The In—O layer is formed along a direction parallel to the surface where the film is formed or to the top surface of the film; therefore, the In—O layer can be illustrated as a layer represented by a dotted line 118 in FIG. 2A. The In—O layer represented by the dotted line 118 is provided so as to cover the side surfaces of the second island-like oxide semiconductor film 106. Since oxygen is difficult to move across the In—O layer, the oxide film 108 containing the In—O layer in a direction parallel to the surface where the oxide film 108 is formed or to the top surface of the oxide film 108 can suppress release of oxygen from the side surfaces of the second oxide semiconductor film 106.

FIG. 2B is a cross-sectional view illustrating only the oxidation film 102, the first oxide semiconductor film 104, the second oxide semiconductor film 106, and the oxide film 108, whose structure is different from that in FIG. 2A. FIG. 2B differs from FIG. 2A in that a trench 120 reaching the oxidation film 102 is formed in a layer of the oxidation film 102, the first oxide semiconductor film 104, and the second oxide semiconductor film 106, and the oxide film 108 is provided so as to cover the side surfaces of the trench 120.

A dotted line 118 of the oxide film 108 in FIG. 2B represents an In—O layer formed along a direction parallel to the surface where the oxide film 108 is formed or to the top surface of the oxide film 108, in a manner similar to that of FIG. 2A. Since oxygen is difficult to move across the In—O layer, the oxide film 108 containing the In—O layer in a direction parallel to the surface where the oxide film 108 is formed or to the top surface of the oxide film 108 can suppress release of oxygen from the side surfaces of the oxidation film 102, the first oxide semiconductor film 104, and the second oxide semiconductor film 106.

Note that when the trench remains even after the oxide film 108 is provided so as to cover the side surfaces of the trench 120, the trench can be filled by forming another insulating film 122. For example, the trench may be filled by providing an insulating film of silicon oxide or the like. Note that polishing treatment (e.g., chemical mechanical polishing (CMP) treatment) may be performed for the purpose of improving the planarity of the surface of the insulating film 122 and exposing the surface of the oxide film 108.

In the above-described embodiment of the present invention, the relative relations of indium, gallium, and zinc contained in each of the first oxide semiconductor film 104, the second oxide semiconductor film 106, and the oxide film 108 are as follows: the second oxide semiconductor film 106 has a higher indium content than the first oxide semiconductor film 104, the first oxide semiconductor film 104 has a higher indium content than the oxide film 108, the oxide film 108 has a higher gallium content than the first oxide semiconductor film 104, and the first oxide semiconductor film 104 has a higher gallium content than the second oxide semiconductor film 106.

With the first oxide semiconductor film 104, the second oxide semiconductor film 106, and the oxide film 108 having the above-described relations, the crystallinity of the second oxide semiconductor film 106 can be improved, and further, release of oxygen from the side surfaces of the second oxide semiconductor film 106 including c-axis aligned crystal parts can be prevented and sufficient oxygen can be contained in the second oxide semiconductor film 106.

This embodiment can be implemented in appropriate combination with any of the other embodiments.

Embodiment 2

In this embodiment, a structure of another transistor that includes an oxide semiconductor film including c-axis aligned crystal parts in a semiconductor device will be described together with a manufacturing method thereof, with reference to a cross-sectional view different from that used in the above embodiment.

FIGS. 3A to 3C illustrate another transistor of one embodiment of the present invention. FIG. 3A is a plan view of the transistor. FIG. 3B is a cross-sectional view taken along line X2-Y2 in a channel length direction in FIG. 3A, and FIG. 3C is a cross-sectional view taken along line V2-W2 in a channel width direction in FIG. 3A.

The transistor illustrated in FIGS. 3A to 3C includes an oxidation film 202 over a substrate 200; a first oxide semiconductor film 204 over the oxidation film 202; a second oxide semiconductor film 206 including c-axis aligned crystal parts over the first oxide semiconductor film 204; a first source electrode 214A and a first drain electrode 214B in contact with side surfaces of the first island-like oxide semiconductor film 204 and the second island-like oxide semiconductor film 206 in the channel length direction; an oxide film 208 which is over part of the first island-like oxide semiconductor film 204 and the second island-like oxide semiconductor film 206 and in contact with the side surfaces in the channel width direction; a gate electrode 210 over the oxide film 208; a sidewall 209 covering a side surface of the gate electrode 210; an insulating film 211 covering a top surface of the gate electrode 210; a second source electrode 213A and a second drain electrode 213B covering top surfaces of the first source electrode 214A and the first drain electrode 214B, a top surface of the second oxide semiconductor film 206, and a side surface and a top of the sidewall 209; and an insulating film 212 over the insulating film 211, the second source electrode 213A and the second drain electrode 213B, and the first source electrode 214A and the first drain electrode 214B. Note that the second oxide semiconductor film 206 includes a channel region 206A in a region overlapping with the gate electrode 210 and low-resistance regions 206B which have lower resistance than the channel region in regions connected to the first source electrode 214A and the first drain electrode 214B and the second source electrode 213A and the second drain electrode 213B.

The transistor illustrated in FIGS. 3A to 3C has a structure in which the formed first oxide semiconductor film 204, the second oxide semiconductor film 206, and the oxide film 208 are stacked in a manner similar to that of Embodiment 1. Thus, the relative relations of indium, gallium, and zinc contained in each of the first oxide semiconductor film 204, the second oxide semiconductor film 206, and the oxide film 208 can be made similar to those in Embodiment 1. Therefore, release of oxygen from the side surfaces of the second oxide semiconductor film 206 in the channel width direction can be prevented and sufficient oxygen can be contained in the second oxide semiconductor film 206. Accordingly, reduction in resistance of a portion indicated by a thick dotted line in FIG. 3A can be suppressed and thus generation of a parasitic channel can be suppressed.

In the structure of FIGS. 3A to 3C in this embodiment, an oxide insulating film is used as the insulating film 212 so that the insulating film 212 can serve as a film for preventing diffusion of oxygen. By providing the oxide insulating film as the insulating film 212, oxygen vacancies in the second oxide semiconductor film 206 can be reduced. Further, as the insulating film 212, an insulating film including a metal oxide can be used. The insulating film including a metal oxide which is provided as the insulating film 212 can serve as a film for preventing entry of hydrogen, water, or the like, which can suppress external entry of hydrogen, water, or the like into the second oxide semiconductor film 206 of the transistor. Accordingly, leakage current of the transistor can be reduced.

Figures 3, 4C:
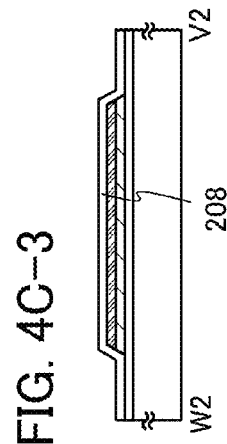
FIGS. 4A-1 to 4A-3 are plan views and FIGS. 4B-1 to 4B-3 and FIGS. 4C-1 to 4C-3 are cross-sectional views, which illustrate an example of a manufacturing process of a semiconductor device.
Figures 2, 4C:
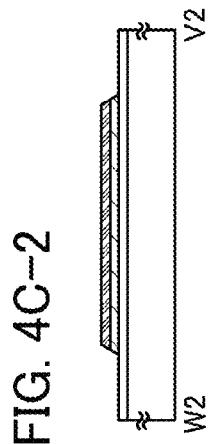
Figures 1, 4C:
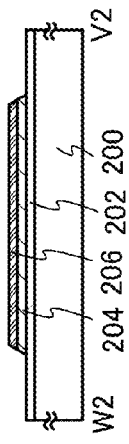
Figures 3, 4B:
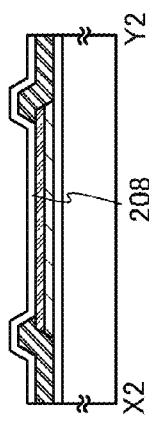
Figures 2, 4B:
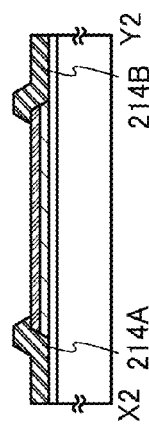
Figures 1, 4B:
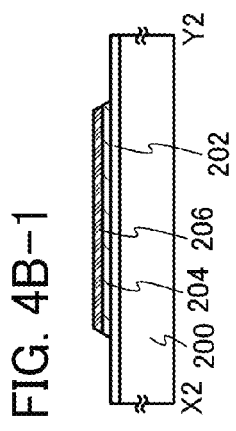
Figures 3, 4A:
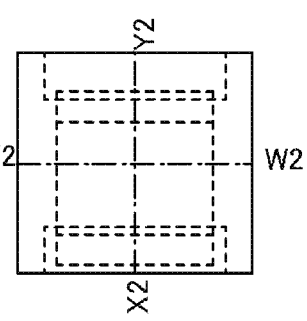
Figures 2, 4A:
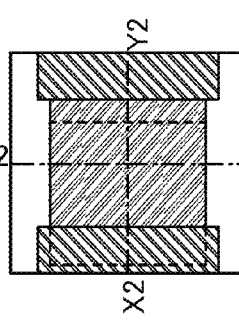
Figures 1, 4A:
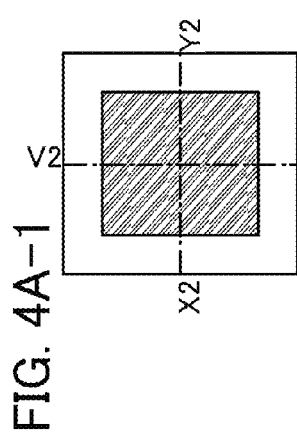

Next, an example of a manufacturing process of the transistor illustrated in FIGS. 3A to 3C will be described with reference to FIGS. 4A-1 to 4A-3, 4B-1 to 4B-3, and 4C-1 to 4C-3, FIGS. 5A-1 to 5A-3, 5B-1 to 5B-3, and 5C-1 to 5C-3, and FIGS. 6A-1 and 6A-2, 6B-1 and 6B-2, and 6C-1 and 6C-2. Note that FIGS. 4A-1 to 4A-3, FIGS. 5A-1 to 5A-3, and FIGS. 6A-1 and 6A-2 each correspond to the plan view of the transistor illustrated in FIG. 3A. FIGS. 4B-1 to 4B-3, FIGS. 5B-1 to 5B-3, and FIGS. 6B-1 and 6B-2 each correspond to the cross-sectional view taken along line X2-Y2 illustrated in FIG. 3B. FIGS. 4C-1 to 4C-3, FIGS. 5C-1 to 5C-3, and FIGS. 6C-1 and 6C-2 each correspond to the cross-sectional view taken along line V2-W2 illustrated in FIG. 3C.

First, the oxidation film 202 is formed over the substrate 200. The oxidation film 202 may be formed by a sputtering method, a CVD method, or the like, and is preferably formed by a method in which hydrogen, water, a hydroxyl group, hydride, and the like do not easily enter.

There is no particular limitation on a substrate that can be used as the substrate 200 as long as it has at least heat resistance to withstand a heat treatment step performed later. As the substrate 200, a glass substrate (preferably a non-alkali glass substrate), a quartz substrate, a ceramic substrate, a plastic substrate, a silicon substrate, or the like can be used.

As the oxidation film 202, a film having an effect of preventing diffusion of hydrogen, moisture, or the like from the substrate 200 is preferred, which can be formed with a single-layer structure or a layered structure using one or more of a silicon oxide film, a silicon nitride oxide film, and a silicon oxynitride film.

In addition, the oxidation film 202 is preferred to be a film having an effect of supplying oxygen to the first oxide semiconductor film 204 and the second oxide semiconductor film 206 including c-axis aligned crystal parts, which are to be formed later, as another effect of the oxidation film 202. In the case where a silicon oxide film is used as the oxidation film 202, for example, part of oxygen therein can be released by heating the oxidation film 202, so that oxygen can be supplied to the first oxide semiconductor film 204 and the second oxide semiconductor film 206 to compensate oxygen vacancies therein.

In particular, the oxide film 202 is preferred to contain oxygen at an amount that exceeds at least the stoichiometry. For example, a silicon oxide film represented by $SiO_{2+\alpha}$ ($\alpha>0$) is preferred to be used as the oxide film 202. With the use of such a silicon oxide film as the oxidation film 202, oxygen can be supplied to the first oxide semiconductor film 204 and the second oxide semiconductor film 206.

Note that the planarity of the surface of the oxidation film 202 is preferred to be improved by performing polishing treatment, dry etching treatment, plasma treatment, or the like. By thus improving the planarity of the surface of the oxidation film 202, the crystallinity of the first oxide semiconductor film 204 and the second oxide semiconductor film 206 which are provided over the oxidation film 202 can be improved.

Next, a first oxide semiconductor film and a second oxide semiconductor film are formed over the oxidation film 202 and then are processed to form the first island-like oxide semiconductor film 204 and the second island-like oxide semiconductor film 206 (FIGS. 4A-1, 4B-1, and 4C-1). The first oxide semiconductor film 204 and the second oxide semiconductor film 206 are formed by a method in which hydrogen, water, a hydroxyl group, hydride, and the like do not easily enter, and is preferably formed by a sputtering method, for example.

The first oxide semiconductor film 204 and the second oxide semiconductor film 206 are each a film including an oxide containing at least indium, gallium, and zinc, and can be formed using an IGZO film. Note that in the IGZO film, part or the whole of gallium which is a stabilizer can be replaced with another stabilizer.

The first oxide semiconductor film 204 and the second oxide semiconductor film 206 can be formed by a sputtering method, an atomic layer deposition (ALD) method, an evaporation method, a coating method, or the like.

The first oxide semiconductor film 204 is formed using an IGZO film having a lower indium content and a higher gallium content than the second oxide semiconductor film 206. Moreover, the first oxide semiconductor film 204 is formed using the IGZO film having a gallium content which is the same as the indium content thereof. For example, an oxide containing In, Ga, and Zn at an atomic ratio of 1:1:1 or an atomic ratio close to the above atomic ratio, or an oxide containing In, Ga, and Zn at an atomic ratio of substantially 1:1:1 is used.

The thickness of the first oxide semiconductor film 204 is greater than 5 nm and less than or equal to 200 nm, preferably greater than or equal to 10 nm and less than or equal to 30 nm. The first oxide semiconductor film 204 is in a single crystal state, a polycrystalline (also referred to as polycrystal) state, an amorphous state, or the like.

The second oxide semiconductor film 206 is formed using an IGZO film having a higher indium content and a lower gallium content than the first oxide semiconductor film 204. Moreover, the second oxide semiconductor film 206 is formed using the IGZO film having a higher indium content than the gallium content thereof. In other words, an oxide in which the relation of the contents can be expressed as In>Ga is used. For example, an oxide containing In, Ga, and Zn at an atomic ratio of 3:1:2 or an atomic ratio close to the above atomic ratio, or an oxide containing In, Ga, and Zn at an atomic ratio of substantially 3:1:2 is used.

The thickness of the second oxide semiconductor film 206 is greater than 5 nm and less than or equal to 200 nm, preferably greater than or equal to 10 nm and less than or equal to 30 nm.

Further, the second oxide semiconductor film 206 includes c-axis aligned crystal parts. In other words, the second oxide semiconductor film 206 has the following features: c-axes are aligned in a direction parallel to a normal vector of the surface where the second oxide semiconductor film is formed or to a normal vector of the top surface of the second oxide semiconductor film; triangular or hexagonal atomic arrangement which is seen from the direction perpendicular to the a-b plane is formed; and metal atoms are arranged in a layered manner or metal atoms and oxygen atoms are arranged in a layered manner when seen from the direction perpendicular to the c-axis.

Since the c-axes of the crystal parts included in the second oxide semiconductor film 206 are aligned in the direction parallel to a normal vector of the surface where the second oxide semiconductor film 206 is formed or to a normal vector of the top surface of the second oxide semiconductor film 206, the directions of the c-axes may be different from each other depending on the shape of the second oxide semiconductor film 206 (the cross-sectional shape of the surface where the second oxide semiconductor film 206 is formed or the cross-sectional shape of the top surface of the second oxide semiconductor film 206). Note that when the second oxide semiconductor film 206 is formed, the direction of c-axis of the crystal part is the direction parallel to a normal vector of the surface where the second oxide semiconductor film 206 is formed or to a normal vector of the top surface of the second oxide semiconductor film 206. The c-axis aligned crystal part is formed by film formation or by performing treatment for crystallization such as heat treatment after film formation.

There are three methods for forming the second oxide semiconductor film 206 including c-axis aligned crystal parts. The first method is to form an oxide semiconductor film at a temperature higher than or equal to 200° C. and lower than or equal to 450° C. to form, in the oxide semiconductor film, crystal parts in which the c-axes are aligned in the direction parallel to a normal vector of the surface where the oxide semiconductor film is formed or to a normal vector of the top surface of the oxide semiconductor film. The second method is to form an oxide semiconductor film with a small thickness and then heat it at a temperature higher than or equal to 200° C. and lower than or equal to 700° C. to form, in the oxide semiconductor film, crystal parts in which the c-axes are aligned in the direction parallel to a normal vector of the surface where the oxide semiconductor film is formed or to a normal vector of the top surface of the oxide semiconductor film. The third method is to form a first oxide semiconductor film with a small thickness, then heat it at a temperature higher than or equal to 200° C. and lower than or equal to 700° C., and form a second oxide semiconductor film to form, in the second oxide semiconductor film, crystal parts in which the c-axes are aligned in the direction parallel to a normal vector of the surface where the second oxide semiconductor film is formed or to a normal vector of the top surface of the second oxide semiconductor film.

The energy gap of the second oxide semiconductor film 206 is 2.8 eV to 3.2 eV, and is greater than that of silicon, 1.1 eV. The minority carrier density of the second oxide semiconductor film 206 is 10 $cm^{-3}$, which is much smaller than the intrinsic carrier density of silicon, $10^{11}$ $cm^{-3}$.

Majority carriers (electrons) of the second oxide semiconductor film 206 flow only from a source of the transistor. Further, the channel region can be depleted completely. Thus, an off-state current of the transistor can be extremely small.

The transistor that includes the second oxide semiconductor film 206 has a small S value, so that an ideal value can be obtained. Further, the transistor has high reliability.

After the second oxide semiconductor film 206 is formed, the second oxide semiconductor film 206 may be subjected to heat treatment. The temperature of the heat treatment is higher than or equal to 300° C. and lower than or equal to 700° C., or lower than the strain point of the substrate. The heat treatment can remove excess hydrogen (including water and a hydroxyl group) from the second oxide semiconductor film 206. Note that the heat treatment is in some cases referred to as dehydration treatment (dehydrogenation treatment) in this specification and the like.

The heat treatment can be performed in such a manner that, for example, an object to be processed is introduced into an electric furnace in which a resistance heater or the like is used and heated at 450° C. in a nitrogen atmosphere for an hour. The second oxide semiconductor film 206 is not exposed to the air during the heat treatment so that the entry of water and hydrogen can be prevented.

The heat treatment apparatus is not limited to the electric furnace and may be an apparatus for heating an object to be processed by thermal conduction or thermal radiation from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

For example, as the heat treatment, the GRTA process may be performed as follows: the object to be processed is put in a heated inert gas atmosphere, heated for several minutes, and taken out of the inert gas atmosphere. The GRTA process enables high-temperature heat treatment for a short time. Moreover, the GRTA process can be employed even when the temperature exceeds the upper temperature limit of the object to be processed. Note that the inert gas may be switched to a gas including oxygen during the process.

Note that as the inert gas atmosphere, an atmosphere that contains nitrogen or a rare gas (e.g., helium, neon, or argon) as its main component and does not contain water, hydrogen, or the like is preferred. For example, the purity of nitrogen or a rare gas such as helium, neon, or argon introduced into a heat treatment apparatus is greater than or equal to 6 N (99.9999%), preferably greater than or equal to 7 N (99.99999%) (i.e., the concentration of the impurities is less than or equal to 1 ppm, preferably less than or equal to 0.1 ppm).

The dehydration treatment (dehydrogenation treatment) might be accompanied by release of oxygen which is a main constituent material of the second oxide semiconductor film 206 to lead to reduction in oxygen. An oxygen vacancy exists in a portion where oxygen is released in the second oxide semiconductor film 206, and a donor level which leads to a change in the electrical characteristics of the transistor is formed owing to oxygen vacancies. Therefore, in the case where the dehydration treatment (dehydrogenation treatment) is performed, oxygen is preferred to be supplied to the second oxide semiconductor film 206. The oxygen vacancies in the second oxide semiconductor film 206 can be compensated with oxygen supplied thereto.

The oxygen vacancy in the second oxide semiconductor film 206 is compensated as follows, for example: after the second oxide semiconductor film 206 is subjected to the dehydration treatment (dehydrogenation treatment), a high-purity oxygen gas, a high-purity dinitrogen monoxide gas, a high-purity nitrous oxide gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew-point instrument of a cavity ring down laser spectroscopy (CRDS) system) is introduced into the same furnace. Water, hydrogen, or the like is preferred not to be contained in the oxygen gas or the dinitrogen monoxide ($N_2O$) gas. The purity of the oxygen gas or dinitrogen monoxide gas which is introduced into the heat treatment apparatus is greater than or equal to 6N (99.9999%), preferably greater than or equal to 7N (99.99999%) (i.e., the impurity concentration in the oxygen gas or the dinitrogen monoxide gas is less than or equal to 1 ppm, preferably less than or equal to 0.1 ppm).

As an example of a method for supplying oxygen to the second oxide semiconductor film 206, oxygen (including at least any one of oxygen radicals, oxygen atoms, and oxygen ions) may be added to the second oxide semiconductor film 206 in order to supply oxygen to the second oxide semiconductor film 206. An ion implantation method, an ion doping method, a plasma immersion ion implantation method, plasma treatment, or the like can be employed as a method for adding oxygen.

As another example of a method for supplying oxygen to the second oxide semiconductor film 206, oxygen may be supplied thereto in such a manner that the oxidation film 202 is heated to release part of oxygen. In particular, in this embodiment, oxygen released from the oxidation film 202 is preferred to be transmitted through the first oxide semiconductor film 204 and supplied to the second oxide semiconductor film 206.

As described above, in the case where the second oxide semiconductor film 206 is formed and then the dehydration treatment (dehydrogenation treatment) is performed to remove hydrogen or moisture from the second oxide semiconductor film 206 so as to highly purify the second oxide semiconductor film 206 not to contain an impurity as much as possible, the following is preferred to be performed on the second oxide semiconductor film 206 as specific treatment: treatment for adding oxygen by which an oxygen vacancy which is generated due to reduced amount of oxygen through the dehydration treatment (dehydrogenation treatment) is compensated by supplying oxygen to the second oxide semiconductor film 206; or treatment for making an oxygen-excess state by which oxygen is supplied to the second oxide semiconductor film 206 so that the oxygen content of which is increased than that in the stoichiometric composition. In this specification and the like, supplying oxygen to the second oxide semiconductor film 206 may be expressed as treatment for adding oxygen, and increasing the oxygen content of the second oxide semiconductor film 206 than that in the stoichiometric composition may be expressed as treatment for making an oxygen-excess state.

Note that in the above-described method, the dehydration treatment (dehydrogenation treatment) and the treatment for adding oxygen may be performed after or before the second oxide semiconductor film 206 is processed into an island shape. Alternatively, after the insulating film 212 is formed, which is to be formed later, heat treatment may be performed so that oxygen is supplied from the oxidation film 202 to the second oxide semiconductor film 206.

In this manner, hydrogen or moisture is removed from the second oxide semiconductor film 206 by the dehydration treatment (dehydrogenation treatment) and oxygen vacancies therein are compensated by the treatment for adding oxygen, whereby the second oxide semiconductor film 206 which is of an i-type (intrinsic) or a substantially i-type (intrinsic) can be formed. The oxide semiconductor film formed in such a manner contains extremely few (close to zero) carriers derived from a donor, and the carrier concentration thereof is lower than $1\times10^{14}/cm^3$, preferably lower than $1\times10^{12}/cm^3$, more preferably lower than $1\times10^{11}/cm^3$.

By removing hydrogen or moisture from the second oxide semiconductor film 206 to highly purify the second oxide semiconductor film 206 so as not to contain impurities as much as possible, and supplying oxygen to compensate oxygen vacancies therein, the second oxide semiconductor film 206 which is of an i-type (intrinsic) or a substantially i-type (intrinsic) can be formed. The off-state current of the transistor that includes the second oxide semiconductor film 206 which is highly purified is as small as 10 yA/mm or less at room temperature, or 1 zA/mm or less at 85° C. to 95° C.

Next, a conductive film is formed to cover the first island-like oxide semiconductor film 204 and the second island-like oxide semiconductor film 206 and then is processed to form the first source electrode 214A and the first drain electrode 214B (FIGS. 4A-2, 4B-2, and 4C-2). The processing may be performed by etching or the like.

As the conductive film used for the first source electrode 214A and the first drain electrode 214B, for example, a metal film containing an element selected from aluminum, chromium, copper, tantalum, titanium, molybdenum, and tungsten, or a metal nitride film containing any of the above elements as its component (e.g., a titanium nitride film, a molybdenum nitride film, or a tungsten nitride film) can be used. Alternatively, the conductive film may have a structure in which a film of a high-melting-point metal such as titanium, molybdenum, or tungsten, or a nitride film of any of these metals (e.g., a titanium nitride film, a molybdenum nitride film, or a tungsten nitride film) is stacked on either or both of the bottom surface and the top surface of a metal film of aluminum, copper, or the like. Alternatively, the conductive film used for the first source electrode 214A and the first drain electrode 214B may be formed using a conductive metal oxide. As the conductive metal oxide, indium oxide ($In_2O_3$), tin oxide ($SnO_2$), zinc oxide (ZnO), indium tin oxide ($In_2O_3$—$SnO_2$, which is abbreviated to ITO), or indium zinc oxide ($In_2O_3$—ZnO) can be used. The conductive film used for the first source electrode 214A and the first drain electrode 214B can be formed using any of the above materials to have a single layer or a layered structure. There is no particular limitation on the method for forming the first source electrode 214A and the first drain electrode 214B, and a variety of film formation methods such as an evaporation method, a PE-CVD method, a sputtering method, or a spin coating method can be employed.

Next, an oxide film 208 is formed to cover the second island-like oxide semiconductor film 206 and the first source electrode 214A and the first drain electrode 214B (FIGS. 4A-3, 4B-3, and 4C-3).

The oxide film 208 has the same crystal structure as the second oxide semiconductor film 206 containing indium, and can be an IGZO film here.

The oxide film 208 can be formed by a sputtering method, an atomic layer deposition (ALD) method, an evaporation method, a coating method, or the like.

The oxide film 208 is formed using an IGZO film having a lower indium content and a higher gallium content than the first oxide semiconductor film 204 and the second oxide semiconductor film 206. Moreover, the oxide film 208 is formed using the IGZO film having a higher gallium content than the indium content thereof. In other words, an oxide in which the relation of the contents can be expressed as Ga>In is used. For example, an oxide containing In, Ga, and Zn at an atomic ratio of 1:3:2 or an atomic ratio close to the above atomic ratio, or an oxide containing In, Ga, and Zn at an atomic ratio of substantially 1:3:2 is used. Further, the energy gap of the oxide film 208 can be increased by having a higher gallium content than the first oxide semiconductor film 204 and the second oxide semiconductor film 206, whereby the oxide film 208 can be used as a layer having an insulating property.

The thickness of the oxide film 208 is greater than 1 nm and less than or equal to 500 nm, preferably greater than or equal to 10 nm and less than or equal to 30 nm Note that since the oxide film 208 has higher dielectric constant than an insulating film containing silicon, the film thickness can be made thicker than the film containing silicon or another insulating film can be stacked on the oxide film 208.

As well as the second oxide semiconductor film 206, the oxide film 208 can include c-axis aligned crystal parts. In other words, the oxide film 208 can have a low oxygen-transmitting property in the c-axis direction parallel to a normal vector of the surface where the film is formed by utilizing a property of oxygen which is difficult to move across an In—O layer.

There is another method for forming the oxide film 208 as a film including c-axis aligned crystal parts in a manner similar to that of the second oxide semiconductor 206. The first method is to form the oxide film 208 at a temperature higher than or equal to 200° C. and lower than or equal to 450° C. to form, in the oxide film 208, crystal parts in which the c-axes are aligned in the direction parallel to a normal vector of the surface where the oxide film 208 is formed or to a normal vector of the top surface of the oxide film 208. The second method is to form an oxide film 208 with a small thickness, then heat it at a temperature higher than or equal to 200° C. and lower than or equal to 700° C. to form, in the oxide film 208, crystal parts in which the c-axes are aligned in the direction parallel to a normal vector of the surface where the oxide film 208 is formed or to a normal vector of the top surface of the oxide film 208. The third method is to form a first oxide film 208 with a small thickness, then heat it at a temperature higher than or equal to 200° C. and lower than or equal to 700° C., and form a second oxide film 208 to form, in the second oxide film 208, crystal parts in which the c-axes are aligned in the direction parallel to a normal vector of the surface where the second oxide film 208 is formed or to a normal vector of the top surface of the second oxide film 208.

Note that in the case where the first oxide semiconductor film 204, the second oxide semiconductor film 206, and the oxide film 208 which each include c-axis aligned crystal parts as described above are deposited by a sputtering method, a sputtering target of a polycrystalline oxide semiconductor is preferred to be used. When an ion collides with the sputtering target, a crystal region included in the sputtering target is sometimes cleaved along an a-b plane and separated as a flat-plate-like sputtered particle or a pellet-like sputtered particle having a plane parallel to the a-b plane. In that case, the flat-plate-like sputtered particle reaches a substrate while maintaining its crystal state, whereby a film including c-axis aligned crystal parts can be deposited.

For the deposition of the film including c-axis aligned crystal parts, the following conditions are preferred to be employed.

By reducing the amount of impurities entering the film including c-axis aligned crystal parts during the deposition, the crystal state can be prevented from being disordered by the impurities. For example, the concentration of impurities (e.g., hydrogen, water, carbon dioxide, or nitrogen) which exist in the deposition chamber may be reduced. Further, the concentration of impurities in a deposition gas may be reduced. Specifically, a deposition gas whose dew point is lower than or equal to −80° C., preferably lower than or equal to −100° C. is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferred that the proportion of oxygen in the deposition gas be increased and the power be optimized in order to reduce plasma damage at the deposition. The proportion of oxygen in the deposition gas is greater than or equal to 30 vol %, preferably 100 vol %.

As an example of the sputtering target, an In—Ga—Zn—O compound target will be described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. The kinds of powder and the molar ratio for mixing powder may be determined as appropriate depending on the desired sputtering target.

Next, a conductive film and an insulating film are formed over the oxide film 208 and then are processed to form the gate electrode 210 and the insulating film 211. Next, a dopant is introduced into the second oxide semiconductor film 206 using the gate electrode 210 and the insulating film 211 as masks, whereby the channel region 206A and the low-resistance regions 206B are formed in the second oxide semiconductor film 206 (FIGS. 5A-1, 5B-1, and 5C-1). Note that the dopant may be introduced not only into the second oxide semiconductor film 206 but also into the first oxide semiconductor film 204, whereby a channel region and low-resistance regions are formed in the first oxide semiconductor film 204.

The dopant is an impurity by which the electrical conductivity of the second oxide semiconductor film 206 is changed. One or more selected from the following can be used as the dopant: Group 15 elements (typical examples thereof are nitrogen (N), phosphorus (P), arsenic (As), and antimony (Sb)), boron (B), aluminum (Al), argon (Ar), helium (He), neon (Ne), indium (In), fluorine (F), chlorine (Cl), titanium (Ti), and zinc (Zn).

As in this embodiment, the dopant can be introduced into the second oxide semiconductor film 206 through the oxide film 208 by an implantation method. An ion implantation method, an ion doping method, a plasma immersion ion implantation method, or the like can be employed as a method for introducing the dopant. In that case, in addition to a single ion of a dopant, an ion of a fluoride or a chloride of the dopant is preferred to be used. The dopant can be introduced into the second oxide semiconductor film 206 by an implantation method without passing through another film.

The introduction of the dopant may be controlled by setting as appropriate the introduction conditions such as the accelerated voltage and the dosage, or the thickness of the films through which the dopant passes. In this embodiment, phosphorus is used as the dopant, and phosphorus ions are implanted by an ion implantation method. The dosage of the dopant can be set to be greater than or equal to $1\times10^{13}$ ions/cm$^2$ and less than or equal to $5\times10^{16}$ ions/cm$^2$.

The concentration of the dopant in the low-resistance regions 206B is preferred to be higher than or equal to $5\times10^{18}$/cm$^3$ and lower than or equal to $1\times10^{22}$/cm$^3$.

Further, the substrate 200 may be heated while the dopant is introduced.

The introduction of the dopant into the second oxide semiconductor film 206 may be performed plural times, and plural kinds of dopant may be used.

Heat treatment may be performed thereon after the dopant introduction. The heat treatment is preferably performed at a temperature higher than or equal to 300° C. and lower than or equal to 700° C., more preferably higher than or equal to 300° C. and lower than or equal to 450° C., under an oxygen atmosphere for an hour. The heat treatment may be performed under a nitrogen atmosphere, reduced pressure, or the air (ultra-dry air).

Since the second oxide semiconductor film 206 includes c-axis aligned crystal parts, part of the second oxide semiconductor film 206 is in some cases made amorphous by introduction of the dopant. In that case, the crystallinity of the second oxide semiconductor film 206 can be recovered by performing heat treatment thereon after the introduction of the dopant.

As a conductive film for forming the gate electrode 210, for example, a metal material such as molybdenum, titanium, tantalum, tungsten, aluminum, copper, neodymium, or scandium, or an alloy material including any of these materials can be used. Alternatively, the gate electrode 210 may be formed using a conductive metal oxide. As the conductive metal oxide, indium oxide ($In_2O_3$), tin oxide ($SnO_2$), zinc oxide (ZnO), indium tin oxide ($In_2O_3$—$SnO_2$, which is abbreviated to ITO), or indium zinc oxide ($In_2O_3$—ZnO), or any of these metal oxide materials in which silicon or silicon oxide is included can be used. The gate electrode 210 can be formed to have a single layer or a layered structure using any of the above materials. There is no particular limitation on the method for forming the gate electrode 210, and a variety of film formation methods such as an evaporation method, a PE-CVD method, a sputtering method, or a spin coating method can be employed.

Further, as an insulating film for forming the insulating film 211, an inorganic insulating film is preferred to be used and is formed as a single layer or a stacked layer using any of a silicon oxide film, a silicon oxynitride film, a silicon nitride film, and a silicon nitride oxide film. There is no particular limitation on a method for forming the insulating film 211; for example, a sputtering method, an MBE method, a PE-CVD method, a pulse laser deposition method, an ALD method, or the like can be employed as appropriate.

Next, an insulating film is formed to cover the gate electrode 210 and the insulating film 211 and then is subjected to highly anisotropic etching, whereby the sidewall 209 is formed in a self-aligned manner (FIGS. 5A-2, 5B-2, and 5C-2). The insulating film for forming the sidewall 209 can be formed by a sputtering method, a CVD method, or the like.

As an etching method for forming the sidewall 209, a dry etching method is preferred to be employed. As an example of an etching gas used for the dry etching method, a gas containing fluorine such as trifluoromethane, octafluorocyclobutane, or tetrafluoromethane can be used. A rare gas or hydrogen may be added to the etching gas. As the dry etching method, a reactive ion etching (RIE) method in which high-frequency voltage is applied to a substrate is preferred to be employed.

As the insulating film for forming the sidewall 209, an inorganic insulating film is preferred to be used and is formed as a single layer or a stacked layer using any of a silicon oxide film, a silicon oxynitride film, a silicon nitride film, and a silicon nitride oxide film.

Next, the oxide film 208 is etched using the insulating film 211 and the sidewall 209 as masks (FIGS. 5A-3, 5B-3, and 5C-3). The oxide film 208 except a region overlapping with the insulating film 211 and the sidewall 209 is removed by the etching.

Next, a conductive film is formed to cover the gate electrode 210, the insulating film 211, the sidewall 209, the exposed second oxide semiconductor film 206, and the first source electrode 214A and the first drain electrode 214B and then is processed to form the second source electrode 213A and the second drain electrode 213B (FIGS. 6A-1, 6B-1, and 6C-1). The processing may be performed by etching or the like.

The conductive film for forming the second source electrode 213A and the second drain electrode 213B is favorably formed using the same material as the first source electrode 214A and the first drain electrode 214B by a variety of film formation methods. Further, it is preferred that the thickness of the conductive film for forming the second source electrode 213A and the second drain electrode 213B be made smaller than the thickness of the first source electrode 214A and the first drain electrode 214B and that the conductive film for forming the second source electrode 213A and the second drain electrode 213B have high coverage by controlling deposition rate or the like.

Next, the insulating film 212 is formed to cover the insulating film 211, the second source electrode 213A and the second drain electrode 213B, and the first source electrode 214A and the first drain electrode 214B (FIGS. 6A-2, 6B-2, and 6C-2).

As a material for forming the insulating film 212, an inorganic insulating film is preferred to be used and is formed as a single layer or a stacked layer using any of oxide insulating films such as a silicon oxide film, a silicon oxynitride film, an aluminum oxide film, an aluminum oxynitride film, a gallium oxide film, and a hafnium oxide film. Further, over the above oxide insulating film, a single layer or a stacked layer of any of nitride insulating films such as a silicon nitride film, a silicon nitride oxide film, an aluminum nitride film, and an aluminum nitride oxide film may be formed. There is no particular limitation on a method for forming the insulating film 212; for example, a sputtering method, an MBE method, a PE-CVD method, a pulse laser deposition method, an ALD method, or the like can be employed as appropriate. In the case where an insulating film including a metal oxide is used as the insulating film 212, a metal oxide film may be formed in such a manner that a metal film is formed and then is subjected to oxygen plasma treatment or the like.

As described above, the transistor illustrated in FIGS. 3A to 3C can be manufactured. Accordingly, a semiconductor device formed using the transistor in which release of oxygen from the side surfaces of the oxide semiconductor films including c-axis aligned crystal parts can be prevented and sufficient oxygen can be contained therein can have improved reliability.

This embodiment can be implemented in appropriate combination with any of the other embodiments.

Embodiment 3

In this embodiment, the structure of the transistor described in Embodiment 2 and a capacitor that can be provided in the same layer as the transistor will be described with reference to the cross-sectional view of FIG. 7A.

A transistor 300 illustrated in the cross-sectional view of FIG. 7A corresponds to the transistor described in Embodiment 2 with reference to FIGS. 3A to 3C. The transistor 300 illustrated in FIG. 7A includes the oxidation film 202 over the substrate 200; the first oxide semiconductor film 204 over the oxidation film 202; the second oxide semiconductor film 206 over the first oxide semiconductor film 204; the first source electrode 214A and the first drain electrode 214B in contact with the side surfaces of the first island-like oxide semiconductor film 204 and the second island-like oxide semiconductor film 206 in the channel length direction; the oxide film 208 which is over part of the first island-like oxide semiconductor film 204 and the second island-like oxide semiconductor film 206 and in contact with the side surfaces in the channel width direction; the gate electrode 210 over the oxide film 208; the sidewall 209 covering the side surfaces of the gate electrode 210; the insulating film 211 covering the top surface of the gate electrode 210; the second source electrode 213A and the second drain electrode 213B covering the top surfaces of the first source electrode 214A and the first drain electrode 214B, the top surface of the second oxide semiconductor film 206, and the side surface and the top of the sidewall 209; and the insulating film 212 over the insulating film 211, the second source electrode 213A and the second drain electrode 213B, and the first source electrode 214A and the first drain electrode 214B. Note that the second oxide semiconductor film 206 includes the channel region 206A in the region overlapping with the gate electrode 210 and the low-resistance regions 206B which have lower resistance than the channel region in the regions connected to the first source electrode 214A and the first drain electrode 214B and the second source electrode 213A and the second drain electrode 213B.

The components for forming the transistor 300 are similar to those for forming the transistor described in Embodiment 2 with reference to FIGS. 3A to 3C. That is, the transistor can be formed using the oxide semiconductor films including c-axis aligned crystal parts, in which release of oxygen from the side surfaces of the oxide semiconductor films including c-axis aligned crystal parts can be prevented and sufficient oxygen can be contained therein.

For a capacitor 301, the components of the transistor 300 can be used. Specifically, an electrode layer 302 which forms one electrode of the capacitor 301 can be formed using the same material as the first source electrode 214A and the first drain electrode 214B.

An insulating film 303 of the capacitor 301 can be formed using the same material as the oxide film 208.

An electrode layer 304 which forms the other electrode of the capacitor 301 can be formed using the same material as the gate electrode 210.

An insulating film 305 of the capacitor 301, which is formed over the electrode layer 304, can be formed using the same material as the insulating film 211.

An insulating film 306 of the capacitor 301, which is formed on a side surface of the electrode layer 304, can be formed using the same material as the sidewall 209.

The insulating film 303 of the capacitor 301 can be formed using the same material as the oxide film 208. In other words, the insulating film 303 has a lower indium content and a higher gallium content than the first oxide semiconductor film 204 and the second oxide semiconductor film 206. Moreover, the oxide film 208 is formed using an IGZO film having a higher gallium content than the indium content thereof, specifically, a film including an oxide containing In, Ga, and Zn at an atomic ratio of 1:3:2 or an atomic ratio close to the above atomic ratio. The insulating film 303 including the oxide can have a dielectric constant as high as approximately 15 compared with an insulating film containing silicon such as silicon oxynitride. Therefore, large electrostatic capacitance of the capacitor 301 can be obtained and thus the size of the capacitor 301 can be reduced.

Next, in FIG. 7B, the structure of a memory device which includes the transistor 300 and the capacitor 301 described in FIG. 7A and which can hold stored data even when not powered and has no limitation on the number of write cycles will be described.

The memory device illustrated in FIG. 7B includes a lower element layer 321 including an n-channel transistor 331 and a p-channel transistor 332 whose channel regions are formed using a silicon material and an upper element layer 324 including the transistor 300 and capacitor 301 described in FIG. 7A, which is electrically connected to the lower element layer 321 through a wiring layer 322 and a wiring layer 323.

The n-channel transistor 331 in FIG. 7B includes an SOI layer 335 provided over a substrate 333 including a semiconductor material (e.g., silicon) with a BOX layer 334 provided therebetween, n-type impurity regions 336 formed in the SOI layer 335, a gate insulating film 337, and a gate electrode 338. Although not illustrated, the SOI layer 335 includes intermetallic compound regions and a channel region in addition to the n-type impurity regions 336. In the p-channel transistor 332, p-type impurity regions 339 are formed in an SOI layer 335.

An element isolation insulating layer 342 is provided between the SOI layers 335 of the n-channel transistor 331 and the p-channel transistor 332, and an insulating film 340 is provided to cover the n-channel transistor 331 and the p-channel transistor 332. Note that in the n-channel transistor 331 and the p-channel transistor 332, with the use of sidewalls formed on side surfaces of the gate electrodes, regions having different concentrations of impurities may be included in the n-type impurity regions 336 and the p-type impurity regions 339. Further, a wiring 341 is provided in the insulating film 340 over the n-type impurity regions 336 and the p-type impurity regions 339, an insulating film 344 in the wiring layer 322 and an insulating film 345 in the wiring layer 323.

The n-channel transistor 331 and the p-channel transistor 332 which each include the SOI layer 335 including a semiconductor material can be operated at high speed. Therefore, with the use of the transistors as reading transistors of the memory device, data can be read at high speed. The transistor 300 and the capacitor 301 is favorably formed in such a manner that the top surface of the wiring 341 is exposed by subjecting the top surface of the wiring layer 323 to CMP treatment.

As described above, in the semiconductor device in this embodiment, the transistors whose channel regions are formed using silicon and the transistor whose channel region is formed using the oxide semiconductor film including c-axis aligned crystal parts, which is described above in Embodiment 1, can be provided by being stacked. As a result, a space for each element can be saved and thus the size of the semiconductor device can be reduced.

This embodiment can be implemented in appropriate combination with any of the other embodiments.

Embodiment 4

In this embodiment, an example of a mode in which another structure is added to the transistor described in Embodiment 1 will be described.

FIGS. 10A to 10C illustrate another transistor of one embodiment of the present invention. FIG. 10A is a plan view of the transistor. FIG. 10B is a cross-sectional view taken along line X3-Y3 in a channel length direction in FIG. 10A, and FIG. 10C is a cross-sectional view taken along line V3-W3 in a channel width direction in FIG. 10A.

The transistor illustrated in FIGS. 10A to 10C includes the oxidation film 102 over the substrate 100, the first oxide semiconductor film 104 over the oxidation film 102, the second oxide semiconductor film 106 over the first oxide semiconductor film 104, the oxide film 108 covering the first island-like oxide semiconductor film 104 and the second island-like oxide semiconductor film 106, an insulating film 401 over the oxide film 108, a gate electrode 110 over the insulating film 401, the interlayer insulating film 112 covering the gate electrode 110, and the source electrode 114A and drain electrode 114B which are over the interlayer insulating film 112 and connected to the second oxide semiconductor film 106. Note that the second oxide semiconductor film 106 includes the channel region 106A in the region overlapping with the gate electrode 110 and the low-resistance regions 106B which have lower resistance than the channel region in the regions connected to the source electrode 114A and drain electrode 114B.

The transistor illustrated in FIGS. 10A to 10C is different from the transistor illustrated in FIGS. 1A to 1C in that the insulating film 401 is included. It is preferred that the insulating film 401 be a protective film having a shielding effect, which prevents penetration of both oxygen and an impurity such as hydrogen or moisture into the second oxide semiconductor film 106.

As the insulating film 401, an inorganic insulating film is preferred to be used and can be formed as a single layer or a stacked layer using any of oxide insulating films such as a silicon oxide film, a silicon oxynitride film, an aluminum oxide film, an aluminum oxynitride film, a gallium oxide film, and a hafnium oxide film. Further, over the above oxide insulating film, a single layer or a stacked layer of any of nitride insulating films such as a silicon nitride film, a silicon nitride oxide film, an aluminum nitride film, and an aluminum nitride oxide film may be formed. For example, as a stacked layer, a silicon oxide film and an aluminum oxide film can be stacked from the gate electrode 110 side by a sputtering method. There is no particular limitation on a method for forming the insulating film 401; for example, a sputtering method, an MBE method, a PE-CVD method, a pulse laser deposition method, an ALD method, or the like can be employed as appropriate.

Alternatively, a particularly dense inorganic insulating film can be formed as the insulating film 401. For example, an aluminum oxide film can be formed by a sputtering method. By forming an aluminum oxide film having high density (a film density of 3.2 g/cm$^3$ or higher, preferably 3.6 g/cm$^3$ or higher), a high shielding effect (blocking effect) of preventing penetration of both oxygen and an impurity such as hydrogen or moisture into the second oxide semiconductor film 106, can be obtained. Therefore, in and after the manufacturing process, the aluminum oxide film functions as a protective film for preventing an impurity such as hydrogen or moisture, which causes variation in the electrical characteristics of the transistor, from being mixed into the second oxide semiconductor film 106 and for preventing oxygen from being released, which is a main constituent material of the second oxide semiconductor film 106. Note that the film density can be measured by Rutherford backscattering spectrometry (RBS) or X-ray reflection (XRR).

This embodiment can be implemented in appropriate combination with any of the other embodiments.

Embodiment 5

In this embodiment, an example of a circuit configuration of a memory device which is formed using the transistor whose channel region is formed using an oxide semiconductor film including c-axis aligned crystal parts, which is described above in Embodiment 1, and which can hold stored data even when not powered and has no limitation on the number of write cycles will be described with reference to drawings.

Figure 8A:
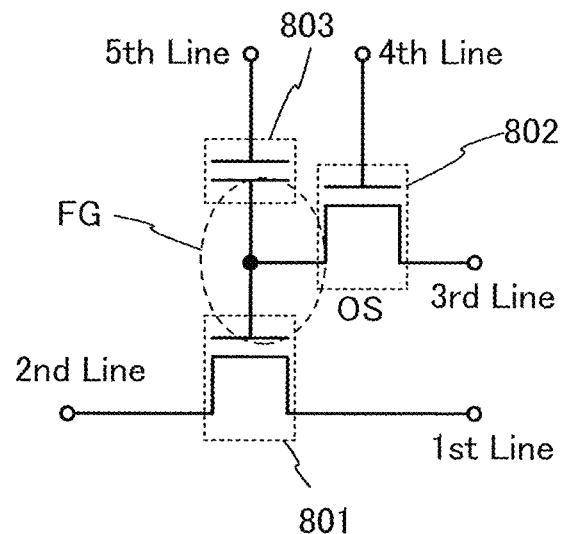
FIGS. 8A and 8B illustrate an example of circuit configuration including a semiconductor device.
Figure 8B:
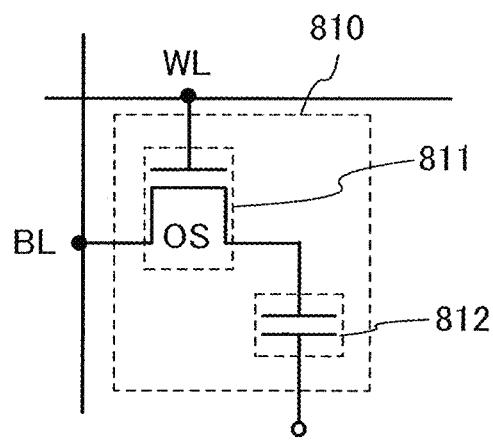

The circuit configuration in FIGS. 8A and 8B is an example in which stored data can be held even when not powered and there is no limitation on the number of write cycles.

In FIG. 8A, a first wiring (1st Line) is connected to one of a source electrode and a drain electrode of a transistor 801. A second wiring (2nd Line) is connected to the other of the source electrode and the drain electrode of the transistor 801. A third wiring (3rd Line) is connected to one of a source electrode and a drain electrode of the transistor 802. A fourth wiring (4th Line) is connected to a gate electrode of the transistor 802. Further, a gate electrode of the transistor 801, the other of the source electrode and the drain electrode of the transistor 802, and one electrode of a capacitor 803 are connected to one another. A fifth wiring (5th Line) is connected to the other electrode of the capacitor 803.

In the figures, "OS" is written to indicate that the transistor 802 is a transistor whose channel region is formed using an oxide semiconductor film including c-axis aligned crystal parts, which is described in the above embodiments.

The circuit configuration in FIG. 8A utilizes the advantage that the potential of the gate electrode of the transistor 801 can be held, whereby writing, holding, and reading of data can be performed as described below.

Writing and holding of data are described. First, the potential of the fourth wiring is set to a potential at which the transistor 802 is turned on, so that the transistor 802 is turned on. Accordingly, the potential of the third wiring is supplied to the gate electrode of the transistor 801 and to the capacitor 803. In other words, a predetermined charge is supplied to the gate electrode of the transistor 801 (i.e., writing of data). Here, one of two kinds of charge providing different potentials (hereinafter referred to as a low-level charge and a high-level charge) is given. After that, the potential of the fourth wiring is set to a potential at which the transistor 802 is off, so that the transistor 802 is turned off. Thus, the charge supplied to the gate electrode of the transistor 801 is held (i.e., holding of data).

Since the off-state current of the transistor 802 is extremely small, the charge of the gate electrode of the transistor 801 is held for a long time.

Next, reading of data is described. By supplying an appropriate potential (reading potential) to the fifth wiring with a predetermined potential (constant potential) supplied to the first wiring, the potential of the second wiring varies depending on the amount of charge held in the gate electrode of the transistor 801. This is because in general, when the transistor 801 is an n-channel transistor, an apparent threshold voltage $V_{th\_H}$ in the case where the high-level electric charge is given to the gate electrode of the transistor 801 is lower than an apparent threshold voltage $V_{th\_L}$ in the case where the low-level electric charge is given to the gate electrode of the transistor 801. Here, the apparent threshold voltage refers to the potential of the fifth wiring, which is needed to turn on the transistor 801. Thus, by setting the potential of the fifth wiring to a potential $V_0$ which is between $V_{th\_H}$ and $V_{th\_L}$, charge given to the gate electrode of the transistor 801 can be determined. For example, in the case where a high-level charge is given in writing, when the potential of the fifth wiring is set to $V_0$ ($>V_{th\_H}$), the transistor 801 is turned on. In the case where a low-level charge is given in writing, even when the potential of the fifth wiring is set to $V_0$ ($<V_{th\_L}$), the transistor 801 remains in an off state. Therefore, the stored data can be read by the potential of the second wiring.

Note that in the case where memory cells are arrayed to be used, only data of desired memory cells need to be read. In the memory cell where data are not read, a potential at which the transistor 801 is turned off regardless of the state of the gate electrode, that is, a potential lower than $V_{th\_H}$ may be supplied to the fifth wiring. Alternatively, a potential at which the transistor 801 is turned on, that is, a potential higher than $V_{th\_L}$ may be supplied to the fifth wiring regardless of the state of the gate electrode.

When a transistor whose channel region is formed using an oxide semiconductor film including c-axis aligned crystal parts, which has extremely small off-state current, is applied to the memory device having the circuit configuration shown in this embodiment, the memory device can hold data for an extremely long period. In other words, power consumption can be sufficiently reduced because refresh operation becomes unnecessary or the frequency of refresh operation can be extremely low. Moreover, stored data can be held for a long period even when power is not supplied (note that a potential is preferred to be fixed).

Further, in the memory device having the circuit configuration shown in this embodiment, high voltage is not needed for writing data and there is no problem of deterioration of elements. For example, unlike a conventional non-volatile memory, it is not necessary to inject and extract electrons into and from a floating gate, and thus a problem such as deterioration of a gate insulating layer does not occur at all. In other words, the memory device in this embodiment does not have the limitation on the number of writing, which is a problem of a conventional nonvolatile memory, and the reliability thereof is significantly improved. Further, data are written depending on the on state and the off state of the transistor, whereby high-speed operation can be easily achieved.

Note that the transistor 801 includes a semiconductor layer formed using silicon, and the transistor 802 includes the second oxide semiconductor film 106 including c-axis aligned crystal parts. In other words, the transistor 801 and the transistor 802 can be provided by being stacked as described in Embodiment 3. As a result, even when the transistor 801 and the transistor 802 differ from each other in size, increase in the size of the memory device can be suppressed.

Next, in FIG. 8B, an example of the circuit configuration in which stored data can be held even when not powered and there is no limitation on the number of write cycles, which is different from the circuit configuration of FIG. 8A, will be described.

In the circuit configuration of a memory cell 810 shown in FIG. 8B, a bit line BL is connected to one of a source electrode and a drain electrode of a transistor 811. A word line WL is connected to a gate electrode of the transistor 811. The other of the source electrode and drain electrode of the transistor 811 is connected to one electrode of a capacitor 812.

The transistor 811 that includes an oxide semiconductor film including c-axis crystal parts has extremely small off-state current. For that reason, the potential of one electrode of the capacitor 812 (or charge accumulated in the capacitor 812) can be held for an extremely long time by turning off the transistor 811.

Next, writing and holding data in the memory cell 810 in FIG. 8B are described.

First, the potential of the word line WL is set to a potential at which the transistor 811 is turned on, so that the transistor 811 is turned on. Accordingly, the potential of the bit line BL is supplied to the one electrode of the capacitor 812 (i.e., writing of data). After that, the potential of the word line WL is set to a potential at which the transistor 811 is turned off, so that the transistor 811 is turned off. Thus, the potential of the one electrode of the capacitor 812 is held (i.e., holding of data).

Since the off-state current of the transistor 811 is extremely small, the potential of the one electrode of the capacitor 812 (or the charge accumulated in the capacitor 812) can be held for a long time.

Next, reading of data is described. When the transistor 811 is turned on, the bit line BL which is in a floating state and the capacitor 812 are electrically connected to each other, and the charge is redistributed between the bit line BL and the capacitor 812. As a result, the potential of the bit line BL is changed. The amount of change in the potential of the bit line BL varies depending on the potential of the one electrode of the capacitor 812 (or the charge accumulated in the capacitor 812).

For example, the potential of the bit line BL after charge redistribution is $(C_B*V_{B0}+C*V)/(C_B+C)$, where V is the potential of the one electrode of the capacitor 812, C is the capacitance of the capacitor 812, $C_B$ is the capacitance of the bit line BL (hereinafter also referred to as bit line capacitance), and $V_{B0}$ is the potential of the bit line BL before the charge redistribution. Therefore, it can be found that assuming that the memory cell 810 is in either of two states in which the potentials of the one electrode of the capacitor 812 are $V_1$ and $V_0$ ($V_1>V_0$), the potential of the bit line BL in the case of holding the potential $V_1$ ($=(C_B*V_{B0}+C*V_1)/(C_B+C)$) is higher than the potential of the bit line BL in the case of holding the potential $V_0$ ($=(C_B*V_{B0}+C*V_0)/(C_B+C)$).

Then, by comparing the potential of the bit line BL with a predetermined potential, data can be read.

As described above, the circuit configuration illustrated in FIG. 8B can hold charge accumulated in the capacitor 812 for a long time because the off-state current of the transistor 811 is extremely small. In other words, power consumption can be sufficiently reduced because refresh operation becomes unnecessary or the frequency of refresh operation can be extremely low. Moreover, stored data can be held for a long period even when power is not supplied.

This embodiment can be implemented in appropriate combination with any of the other embodiments. Therefore, the memory device formed using the transistor that includes the oxide semiconductor film including c-axis aligned crystal parts can have higher reliability.

Embodiment 6

In this embodiment, a structure example of a nonvolatile flip-flop including a pair of a volatile memory portion formed using a transistor whose channel region is formed using silicon and a nonvolatile memory portion formed using the transistor whose channel region is formed using an oxide semiconductor film including c-axis aligned crystal parts, which is described above in Embodiment 1, will be described. With one or more such nonvolatile flip-flops, a nonvolatile register that can store one-bit or multi-bit data can be obtained.

Figure 9A:
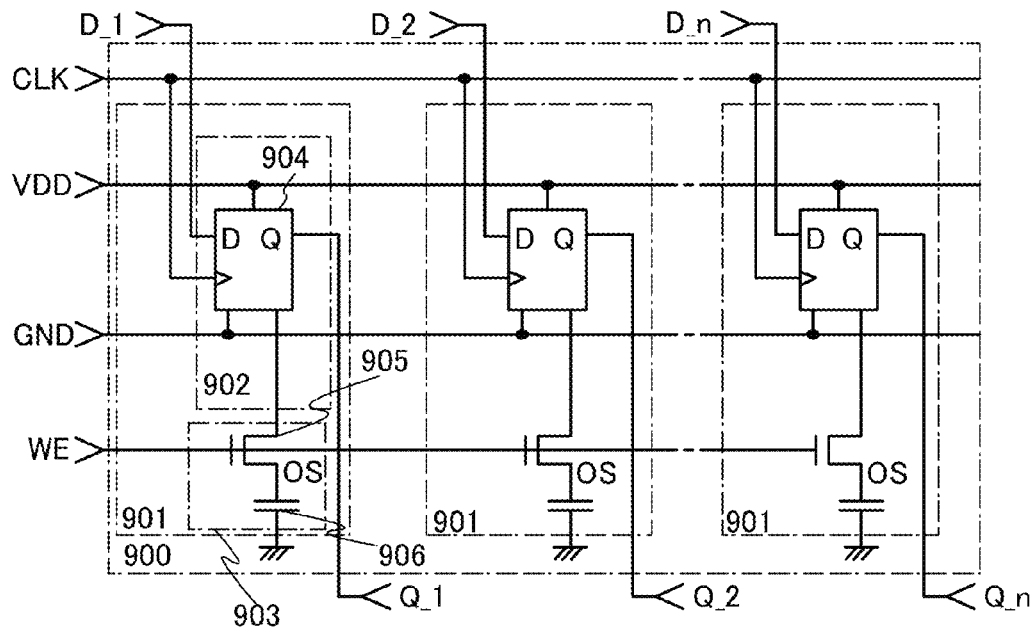
FIGS. 9A and 9B are block diagrams of a CPU including a semiconductor device.

FIG. 9A shows an example of a block diagram of a nonvolatile register that can store n-bit data. A nonvolatile register 900 shown in FIG. 9A includes n nonvolatile flip-flops 901.

The nonvolatile flip-flop 901 includes a volatile memory portion 902 and a nonvolatile memory portion 903.

The volatile memory portion 902 includes a flip-flop 904. In FIG. 9A, a D-flip-flop is shown as an example of the flip-flop 904. Power is supplied from a high power supply potential VDD and a low power supply potential GND to the flip-flop 904 of the volatile memory portion 902, and a clock signal CLK and data D_1 to D_n are input into the flip-flop 904 thereof. Besides, a signal for inputting and outputting data, performing initialization, or the like may be input into the flip-flop 904 depending on its circuit configuration. The data D_1 to D_n input into a terminal D of the flip-flop 904 are held and output from output terminals Q_1 to Q_n in synchronization with the clock signal CLK.

Note that the flip-flop 904 is formed using a plurality of transistors whose channel regions are formed using silicon. The flip-flop 904 is formed using a miniaturized transistor so as to read or write data at high speed.

The nonvolatile memory portion 903 includes a transistor 905 whose channel region is formed using an oxide semiconductor film and a capacitor 906. In the nonvolatile memory portion 903 shown in FIG. 9A, the capacitor 906 can be charged and discharged with a charge by turning on the transistor 905 by a control signal WE, and in the nonvolatile memory portion 903 shown in FIG. 9A, the charge held in the capacitor 906 is held by turning off the transistor 905 by a control signal WE. Even when power is not supplied, the charge can be held in the capacitor 906 in accordance with the logic state of data by utilizing an extremely small leakage current of the transistor 905.

Note that the transistor 905 corresponds to the transistor whose channel region is formed using an oxide semiconductor, which is described above in Embodiment 1. Therefore, in the transistor 905, release of oxygen from side surfaces of the oxide semiconductor films including c-axis aligned crystal parts can be prevented and sufficient oxygen can be contained therein, whereby the reliability of the nonvolatile register 900 can be improved.

Figure 9B:
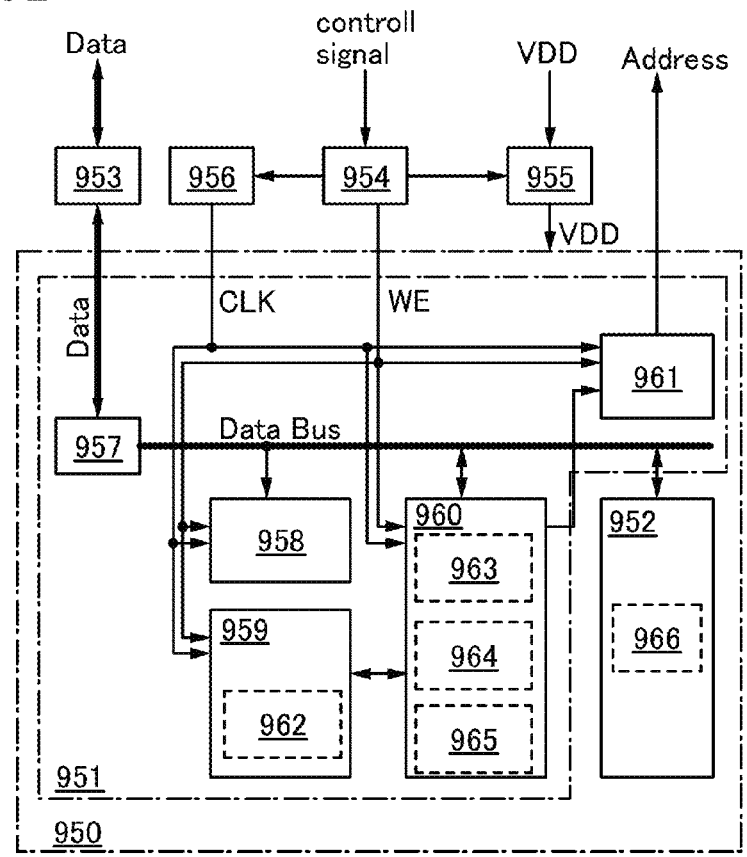

Next, a specific mode in the case where the nonvolatile register is used for a CPU will be described. An example of a block diagram of a CPU and peripheral circuits thereof are illustrated in FIG. 9B.

A CPU 950 includes a controller portion 951 and an arithmetic unit portion 952. In FIG. 9B, as the peripheral circuits of the CPU 950, a data buffer circuit 953, a power source control circuit 954, a power switching circuit 955, and an internal control signal generation circuit 956 are shown.

The controller portion 951 includes a data latch circuit 957, an instruction register circuit 958, a control circuit 959, a register group 960, and an address buffer circuit 961. The control circuit 959 includes a state machine 962. The register group 960 includes a program counter 963, a general purpose register circuit 964, and an arithmetic register circuit 965. The arithmetic unit portion 952 includes an arithmetic logic unit (ALU) 966.

Data, an address, and a control signal are input and output into and from each circuit of the CPU and the peripheral circuits thereof via an address bus and a control bus in addition to a data bus. Note that in FIG. 9B, the data bus is indicated by a heavy line, the control bus is indicated by a thin line, and the address bus is omitted.

The data buffer circuit 953 is a buffer memory circuit that temporarily stores data including an instruction (program) which is input and output into and from the controller portion 951. The power source control circuit 954 controls supply of power in the power switching circuit 955 depending on a control signal input from the outside and outputs a control signal WE for controlling a nonvolatile register included in each circuit of the controller portion 951. The power switching circuit 955 switches whether to supply or not power input from the outside depending on the control of the power source control circuit 954. The internal control signal generation circuit 956 outputs a clock signal CLK for controlling the nonvolatile register included in each circuit of the controller portion 951 depending on the control of the power source control circuit 954.

The data latch circuit 957 temporarily stores data including an instruction (program) which is input and output into and from the controller portion 951 and then selectively supplies the data to each circuit of the controller portion 951 via the data bus. The instruction register circuit 958 temporarily stores instruction data transmitted to the controller portion 951. The control circuit 959 has a function of decoding the input instruction and making each circuit of the controller portion 951 execute the instruction. Further, the state machine 962 of the control circuit 959 temporarily stores the state of the controller portion 951. The program counter 963 of the register group 960 stores an address of an instruction to be executed next. The general purpose register circuit 964 of the register group 960 temporarily stores data read from an external main memory device. The arithmetic register circuit 965 of the register group 960 temporarily stores data which are obtained during arithmetic processing of the ALU 966. The address buffer circuit 961 temporarily stores and outputs an address of an instruction to be executed next to the external main memory device. The ALU 966 of the arithmetic unit portion 952 has a function of performing a variety of arithmetic operations such as four arithmetic operations and logic operations.

Next, the operation of the CPU 950 will be described.

In response to an address of an instruction to be executed, the CPU 950 accesses a corresponding address of the main memory device via the address buffer circuit 961. Then, the instruction is read from the external main memory device and stored in the instruction register circuit 958.

The CPU 950 decodes and executes the instruction stored in the instruction register circuit 958. Specifically, when arithmetic processing is performed on the decoded instruction, the control circuit 959 generates various signals for controlling the operation of the ALU 966 in response to the decoded instruction. The ALU 966 performs arithmetic processing using data stored in the general purpose register circuit 964 and temporarily stores the data obtained by the arithmetic processing in the general purpose register circuit 964 or the arithmetic register circuit 965. In the case of storing or reading data, the CPU 950 accesses as appropriate the external main memory device or each circuit of the register group 960 in response to the decoded instruction.

Note that in the CPU 950 shown in FIG. 9B, the instruction register circuit 958, the control circuit 959, the register group 960, and the address buffer circuit 961 of the controller portion 951, which temporarily store data, each include the above-described nonvolatile register. In other words, the data of the instruction register circuit 958, the control circuit 959, the register group 960, and the address buffer circuit 961 of the controller portion 951 are not erased even when the supply of power is stopped, and the state where data is restored can be obtained when power is supplied again. As a result, power consumption can be reduced in the case where rereading of data in the CPU 950 or the supply of power is not needed.

This embodiment can be implemented in appropriate combination with any of the other embodiments. Therefore, the CPU described in this embodiment can be formed using the transistor that includes the oxide semiconductor film including c-axis aligned crystal parts and thus a highly reliable CPU can be obtained.

Example 1

In this example, in an IGZO film which is a ternary metal oxide as an example of the oxide semiconductor film including c-axis aligned crystal parts, the results of computations of an excess oxygen atom (an oxygen atom whose proportion is in excess of the proportion of oxygen in stoichiometry) mobility and oxygen vacancy mobility will be described.

Note that in the computation, a model in which one excess oxygen atom or one oxygen vacancy exists in one In—O plane of one IGZO (312) plane is formed by structure optimization (see FIGS. 11A to 11C and FIGS. 13A to 13C), and each energy of intermediate structures along a minimum energy path was calculated by a nudged elastic band (NEB) method.

The computation was performed using calculation program software "OpenMX" based on the density functional theory (DFT). Parameters are described below.

As a basis function, a pseudoatom local basis function was used. The basis function is classified into polarization basis sets STO (slater type orbital).

As a functional, generalized-gradient-approximation/Perdew-Burke-Ernzerhof (GGA/PBE) was used.

The cut-off energy was 200 Ry.

The sampling point k was 5×5×3.

In the computation of mobility of an excess oxygen atom, the number of atoms which existed in the computation model was set to 85, and in the computation of oxygen vacancy mobility, the number of atoms which existed in the computation model was set to 83.

Mobility of an excess oxygen atom and mobility of an oxygen vacancy are evaluated by calculation of a height Eb of energy barrier which is required to go over in moving to respective sites. In other words, when the height Eb of energy barrier which is gone over in moving is high, an excess oxygen atom or an oxygen vacancy hardly moves, and when the height Eb of the energy barrier is low, excess oxygen or an oxygen vacancy easily moves.

Figure 12:
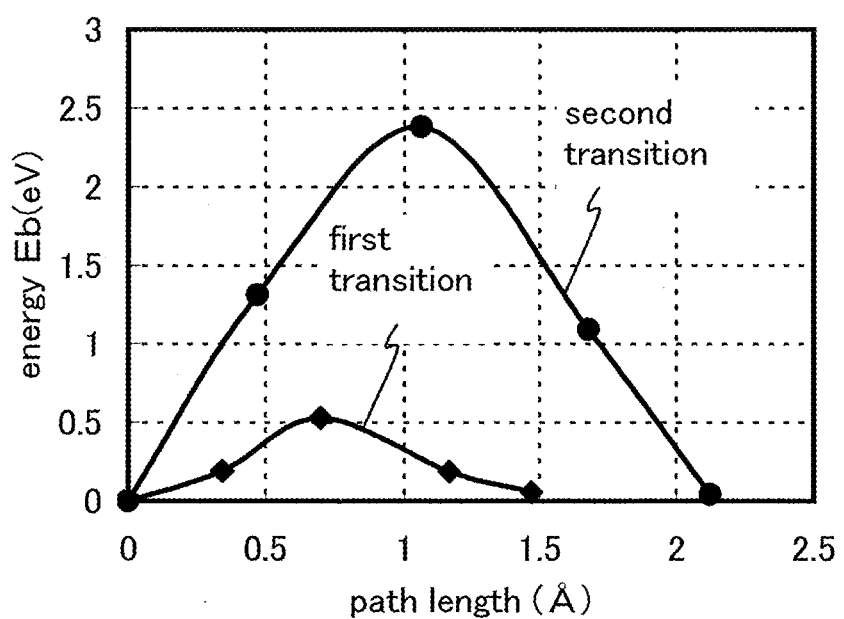
FIG. 12 is a graph for describing a structure of Example.

First, movement of an excess oxygen atom is described. FIGS. 11A to 11C show models used for computation of movement of an excess oxygen atom. The computations of two transition forms described below were performed. FIG. 12 shows the computations results. In FIG. 12, the horizontal axis indicates a path length (of movement of an excess oxygen atom), and the vertical axis indicates energy (required for the movement) with respect to energy in a state of a model A in FIG. 11A.

In two transition forms of the movement of an excess oxygen atom, a first transition is a transition from the model A to a model B, and a second transition is a transition from the model A to a model C.

In FIGS. 11A to 11C, an oxygen atom denoted by "1" is referred to as a first oxygen atom of the model A; an oxygen atom denoted by "2" is referred to as a second oxygen atom of the model A; and an oxygen atom denoted by "3" is referred to as a third oxygen atom of the model A.

As seen from FIG. 12, the maximum value ($Eb_{max}$) of the height Eb of the energy barrier in the first transition is 0.53 eV, and that of the second transition is 2.38 eV. That is, the maximum value ($Eb_{max}$) of the height Eb of the energy barrier in the first transition is lower than that of the second transition. Accordingly, energy required for the first transition is smaller than energy required for the second transition, and the first transition occurs more easily than the second transition.

In other words, the first oxygen atom of the model A moves more easily in the direction in which the second oxygen atom of the model A is pushed than in the direction in which the third oxygen atom of the model A is pushed. Accordingly, this shows that the oxygen atom moves more easily along a layer of indium atoms than across the layer of indium atoms.

Figure 13A:
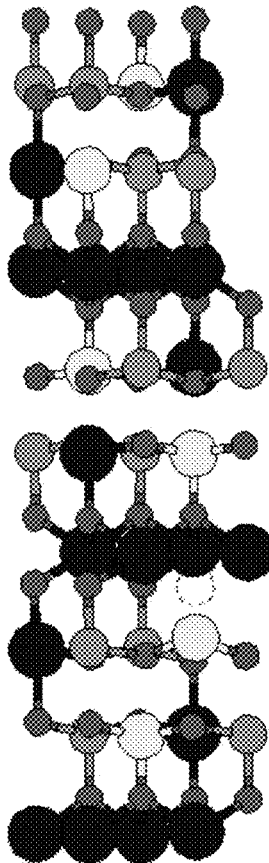
FIGS. 13A to 13C are diagrams for describing a structure of Example.
Figure 13B:
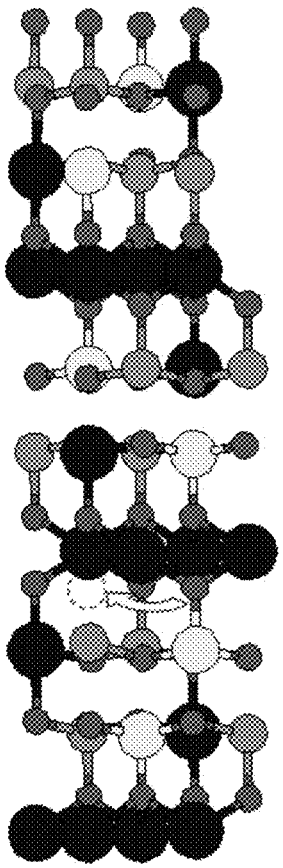
Figure 13C:
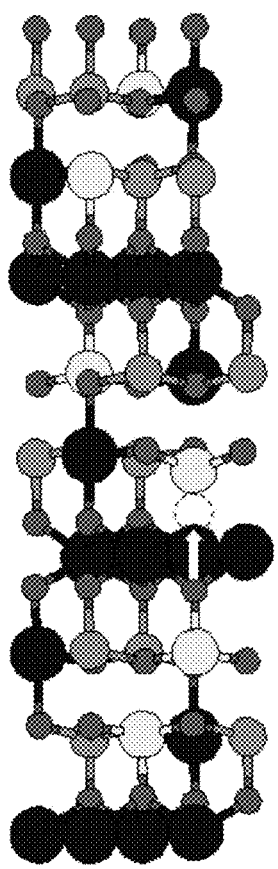
Figure 14:
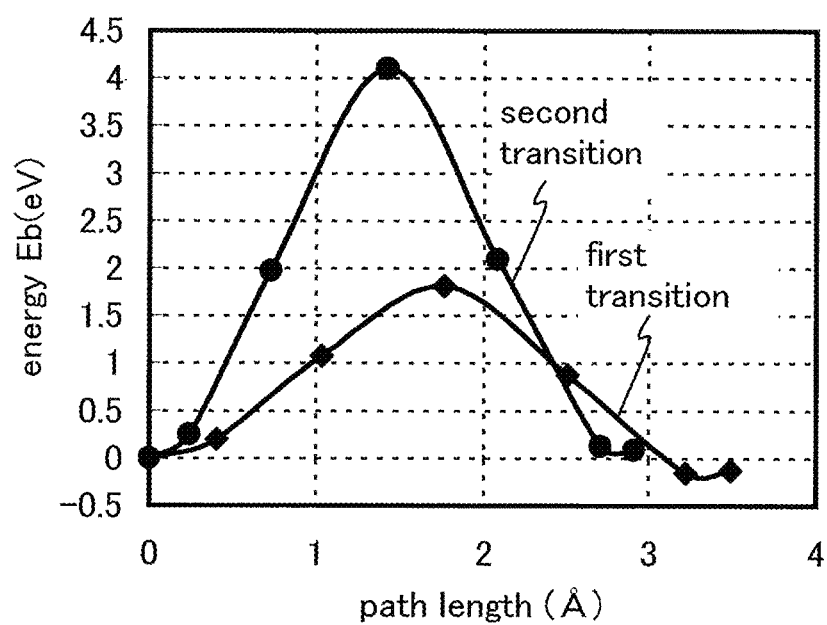
FIG. 14 is a graph for describing a structure of Example.

Next, oxygen vacancy movement is described. FIGS. 13A to 13C show models used for computation of oxygen vacancy movement. The computations of two transition forms described below were performed. FIG. 14 shows the computations results. In FIG. 14, the horizontal axis indicates a path length (of oxygen vacancy movement), and the vertical axis indicates energy (required for the movement) with respect to energy in a state of a model A in FIG. 13A.

In the two transition forms of the oxygen vacancy movement, a first transition is a transition from the model A to a model B, and a second transition is a transition from the model A to a model C.

Note that dotted circles in FIGS. 13A to 13C represent oxygen vacancies.

As is seen from FIG. 14, the maximum value ($Eb_{max}$) of the height Eb of the energy barrier of the first transition is 1.81 eV, and that of the second transition is 4.10 eV. That is, the maximum value ($Eb_{max}$) of the height Eb of the energy bather of the first transition is lower than that of the second transition. Accordingly, energy required for the first transition is smaller than energy required for the second transition, and the first transition occurs more easily than the second transition.

That is, the oxygen vacancy of the model A moves more easily to the position of an oxygen vacancy of the model B than to the position of an oxygen vacancy of the model C. Accordingly, this shows that the oxygen vacancy also moves more easily along a layer of indium atoms than across the layer of indium atoms.

Next, in order to compare probabilities of occurrence of the above-described four transition forms from another aspect, temperature dependence of these transitions is described. The above-described four transition forms are (1) the first transition of an excess oxygen atom, (2) the second transition of the excess oxygen atom, (3) the first transition of an oxygen vacancy, and (4) the second transition of the oxygen vacancy.

Temperature dependence of these transitions is compared with each other based on movement frequency per unit time. Here, movement frequency Z (per second) at certain temperature T (K) is represented by the following formula (1) when the number of vibrations Zo (per second) of an oxygen atom in the chemically stable position is used.

[FORMULA 1]

$$Z = Zo \cdot \exp\left(-\frac{Eb_{max}}{kT}\right) \quad (1)$$

Note that in the formula (1), $\underline{Eb_{max}}$ represents the maximum value of the height Eb of an energy barrier of each transition, and k represents a Boltzmann constant. Further, $Zo=1.0\times10^{13}$ (per second) is used for the calculation.

In the case where an excess oxygen atom or an oxygen vacancy moves once per second (in the case of Z=1 (per second)) beyond the maximum value ($Eb_{max}$) of the height Eb of the energy barrier, when the formula (1) is solved for T, the following formulae are obtained:
(1) In the first transition of an excess oxygen atom where Z=1, T=206 K (−67° C.);
(2) In the second transition of the excess oxygen atom where Z=1, T=923 K (650° C.);
(3) In the first transition of an oxygen vacancy where Z=1, T=701 K (428° C.); and
(4) In the second transition of the oxygen vacancy where Z=1, T=1590 K (1317° C.).
On the other hand, Z in the case where T=300 K (27° C.) is as follows:
(1) In the first transition of an excess oxygen atom where T=300 K, $Z=1.2\times10^{4}$ (per second);
(2) In the second transition of the excess oxygen atom where T=300 K, $Z=1.0\times10^{-27}$ (per second);
(3) In the first transition of an oxygen vacancy where T=300 K, $Z=4.3\times10^{-18}$ (per second); and
(4) In the second transition of the oxygen vacancy where T=300 K, $Z=1.4\times10^{-56}$ (per second).
Further, Z in the case where T=723 K (450° C.) is as follows:
(1) In the first transition of an excess oxygen atom where T=723 K, $Z=2.0\times10^{9}$ (per second);
(2) In the second transition of the excess oxygen atom where T=723 K, $Z=2.5\times10^{-4}$ (per second);
(3) In the first transition of an oxygen vacancy where T=723 K, Z=2.5 (per second); and
(4) In the second transition of the oxygen vacancy where T=723 K, $Z=2.5\times10^{-16}$ (per second).

In view of the above-described calculation, in the case where either T=300 K or T=723 K, an excess oxygen atom moves more easily along a layer of indium atoms than across the layer of indium atoms. Moreover, in the case where either T=300 K or T=723 K, an oxygen vacancy also moves more easily along the layer of indium atoms than across the layer of indium atoms.

Further, in the case where T=300 K, the movement of the excess oxygen atom along the layer of indium atoms occurs extremely easily; however, the other transitions do not occur easily. In the case where T=723 K, not only the movement of the excess oxygen atom along the layer of indium atoms but the movement of the oxygen vacancy along the layer of indium atoms occurs easily; however, either the excess oxygen atom or the oxygen vacancy is difficult to move across the layer of indium atoms.

Thus, for example, as in the oxide semiconductor film including c-axis aligned crystal parts, in the case where a layer of indium atoms exists on a plane parallel to the surface where the oxide semiconductor film is formed or to the top surface of the oxide semiconductor film, either an excess oxygen atom or an oxygen vacancy moves easily along the surface where the oxide semiconductor film is formed or the top surface of the oxide semiconductor film.

As described above, it was evident from the computations in this example that, in the oxide semiconductor film including c-axis aligned crystal parts, an excessive oxygen atom and an oxygen vacancy easily moved along the surface where the oxide semiconductor film was formed or the top surface of the oxide semiconductor film. In consideration of such mobility of oxygen, it was evident that oxygen was easily released from side surfaces of the oxide semiconductor film including c-axis aligned crystal parts and thus an oxygen vacancy was easily generated. Accordingly, oxygen is easily released from a side surface of the oxide semiconductor film. In the case where the oxide semiconductor film including c-axis aligned crystal parts is processed into an island shape in the transistor that includes such an oxide semiconductor film, the side surfaces are exposed and oxygen vacancies are generated easily. As described in the above embodiments, according to one embodiment of the present invention, the oxygen vacancies can be reduced and reduction in reliability of a semiconductor device that includes the oxide semiconductor film including c-axis aligned crystal parts can be suppressed.

Note that the case where the excess oxygen atom or the oxygen vacancy moves across the layer of indium atoms is described above; however, the present invention is not limited thereto, and the same applies to layers of metals other than indium which are contained in the oxide semiconductor film.

This application is based on Japanese Patent Application serial No. 2012-020510 filed with the Japan Patent Office on Feb. 2, 2012, the entire contents of which are hereby incorporated by reference.

What is claimed is:

1. A semiconductor device comprising:
   a first oxide film over an insulating surface;
   a second oxide film over the first oxide film; and
   a third oxide film over the second oxide film,
   wherein the third oxide film is in contact with a side surface of the second oxide film,
   wherein each of the first oxide film, the second oxide film, and the third oxide film comprises indium, gallium, and zinc,
   wherein a gallium content is higher than an indium content in the third oxide film,
   wherein the gallium content is higher than a zinc content in the third oxide film, and
   wherein an indium content in the second oxide film is higher than the indium content in the third oxide film.

2. The semiconductor device according to claim 1, wherein an atomic, ratio of indium, gallium, and zinc in the third oxide film is substantially 1:3:2.

3. The semiconductor device according to claim 1, wherein the third oxide film comprises a c-axis aligned crystal part.

4. The semiconductor device according to claim 1, wherein the third oxide film has an insulating property.

5. The semiconductor device according to claim 1, wherein the third oxide film is in contact with a side surface of the first oxide film.

6. The semiconductor device according to claim 1, further comprising an insulating film and a gate electrode, wherein the insulating film is provided between the gate electrode and the third oxide film.

7. The semiconductor device according to claim 1, wherein the second oxide film comprises a channel formation region.

8. The semiconductor device according to claim 1, wherein an energy gap of the third oxide film is higher than an energy gap of the second oxide film.

9. The semiconductor device according to claim 1, wherein the second oxide film comprises nitrogen.

10. A semiconductor device comprising:
a first oxide film over an insulating surface;
a second oxide film over the first oxide film;
a third oxide film over the second oxide film; and
an electrode in contact with the second oxide film,
wherein the third oxide film is in contact with a side surface of the second oxide film,
wherein each of the first oxide film, the second oxide film, and the third oxide film comprises indium, gallium, and zinc,
wherein a gallium content is higher than an indium content in the third oxide film,
wherein the gallium content is higher than a zinc content in the third oxide film, and
wherein an indium content in the second oxide film is higher than the indium content in the third oxide film.

11. The semiconductor device according to claim 10, wherein an atomic ratio of indium, gallium, and zinc in the third oxide film is substantially 1:3:2.

12. The semiconductor device according to claim 10, wherein the third oxide film comprises a c-axis aligned crystal part.

13. The semiconductor device according to claim 10, wherein the third oxide film has an insulating property.

14. The semiconductor device according to claim 10, wherein the third oxide film is in contact with a side surface of the first oxide film.

15. The semiconductor device according to claim 10, further comprising an insulating film and a gate electrode,
wherein the insulating film is provided between the gate electrode and the third oxide film.

16. The semiconductor device according to claim 10, wherein the second oxide film comprises a channel formation region.

17. The semiconductor device according to claim 10, wherein an energy gap of the third oxide film is higher than an energy gap of the second oxide film.

18. The semiconductor device according to claim 10, wherein the second oxide film comprises nitrogen.

19. The semiconductor device according to claim 10, wherein the electrode comprises a nitride of tantalum.

* * * * *